(12) United States Patent
Lahiri et al.

(10) Patent No.: US 8,106,651 B2
(45) Date of Patent: Jan. 31, 2012

(54) METHODS AND APPARATUSES FOR DETERMINING THICKNESS OF A CONDUCTIVE LAYER

(75) Inventors: Sudeep Kumar Lahiri, Mountain View, CA (US); Paul Franzen, West Linn, OR (US)

(73) Assignee: Novellus Systems, Inc., San Jose, CA (US)

( * ) Notice: Subject to any disclaimer, the term of this patent is extended or adjusted under 35 U.S.C. 154(b) by 265 days.

(21) Appl. No.: 12/105,060

(22) Filed: Apr. 17, 2008

(65) Prior Publication Data

US 2009/0263918 A1    Oct. 22, 2009

(51) Int. Cl.
*G01B 7/06* (2006.01)
*G01N 27/02* (2006.01)
*B24B 49/10* (2006.01)

(52) U.S. Cl. .............................. 324/230; 324/229; 451/8

(58) Field of Classification Search ................... 324/222, 324/225, 228, 229, 230, 231, 234, 239; 451/5, 451/8, 41, 285; 702/57, 170
See application file for complete search history.

(56) References Cited

U.S. PATENT DOCUMENTS

| | | | |
|---|---|---|---|
| 3,764,897 A * | 10/1973 | Greenwood | ................... 324/229 |
| 5,847,562 A | 12/1998 | Fulton et al. | |
| 6,579,800 B2 | 6/2003 | Basol et al. | |
| 6,602,724 B2 | 8/2003 | Redeker et al. | |
| 6,722,946 B2 | 4/2004 | Talieh et al. | |
| 6,741,076 B2 | 5/2004 | Le | |
| 6,815,947 B2 | 11/2004 | Scheiner et al. | |
| 6,857,947 B2 | 2/2005 | Wang et al. | |
| 6,866,763 B2 | 3/2005 | Basol et al. | |
| 6,908,374 B2 | 6/2005 | Wang et al. | |
| 6,942,546 B2 | 9/2005 | Desai et al. | |
| 7,097,538 B2 | 8/2006 | Talieh et al. | |
| 7,189,140 B1 | 3/2007 | Shugrue et al. | |
| 7,198,545 B1 | 4/2007 | Korovin et al. | |
| 7,229,339 B2 | 6/2007 | Stumpf et al. | |
| 7,264,537 B1 * | 9/2007 | Laursen et al. | .................... 451/8 |
| 2004/0189290 A1 * | 9/2004 | Lehman et al. | ................ 324/230 |
| 2007/0103150 A1 * | 5/2007 | Tada et al. | ..................... 324/229 |

(Continued)

FOREIGN PATENT DOCUMENTS

JP     2003-106805      9/2003
WO    WO 2009/129065   10/2009

OTHER PUBLICATIONS

Groff et al., Piecewise Linear Homeomorphisms; the Scalar Case, vol. 3, p. 3259, International Joint Conference on Neural Networks, 2000.*

(Continued)

*Primary Examiner* — Bot Ledynh
(74) *Attorney, Agent, or Firm* — Knobbe, Martens, Olson & Bear LLP

(57) ABSTRACT

Methods and apparatuses for calibrating eddy current sensors. A calibration curve is formed relating thickness of a conductive layer in a magnetic field to a value measured by the eddy current sensors or a value derived from such measurement, such as argument of impedance. The calibration curve may be an analytic function having infinite number terms, such as trigonometric, hyperbolic, and logarithmic, or a continuous plurality of functions, such as lines. High accuracy allows the omission of optical sensors, and use of eddy current sensors for endpoint detection, transition call detection, and closed loop control in which a process parameter is changed based on the measured magnetic flux density change in one or more processing zones.

32 Claims, 23 Drawing Sheets

U.S. PATENT DOCUMENTS

2008/0290865 A1* 11/2008 Fujita et al. .................. 324/230
2009/0251137 A1 10/2009 Daalmans et al.

OTHER PUBLICATIONS

Eubank et al., Curve Fitting by Polynomial-Trigonometric Regression, Biometrika vol. 77, pp. 1-9, 1990.*

International Search Report and Written Opinion for International Application No. PCT/US2009/039537, mailed on Oct. 1, 2009, in 15 pages.
International Preliminary Report on Patentability and Written Opinion of the International Searching Authority for International Application No. PCT/US2009/039537, mailed on Oct. 28, 2010, in 9 pages.

* cited by examiner

METHODS AND APPARATUSES FOR DETERMINING THICKNESS OF A CONDUCTIVE LAYER

BACKGROUND

1. Field

The present application relates generally to layer thickness measurement, and, more particularly, to layer thickness measurement in conductive layer processing tools.

2. Description of the Related Art

Integrated circuits are generally manufactured by forming various materials, such as metals and dielectrics, on a wafer to create composite thin films and patterning the layers. It can often be useful to have an accurate measure of the thickness of a layer formed on a substrate. For example, a layer can be initially over-deposited onto the wafer to form a relatively thick layer, and a planarization process is employed to thin the layer to a desired thickness. Knowing the thickness of the layer can help control the planarization process.

Methods of determining layer thickness include in situ and ex situ techniques. Known processes each have particular advantages and disadvantages for various applications.

SUMMARY

In certain embodiments, a method of processing a wafer comprises changing the thickness of a conductive layer on the wafer and during changing, monitoring the thickness of the conductive layer. Monitoring the thickness comprises correlating a measurement from an eddy current sensor to a thickness of the conductive layer. Correlating the measurement to the thickness comprises applying a model that includes either (1) a plurality of functions between measurement points of known thicknesses or (2) an analytic function having infinite order terms.

In certain embodiments, a method of determining a thickness of a conductive layer on a workpiece comprises measuring a magnetic flux density change when the conductive layer on the workpiece is in a magnetic field and calculating the thickness of the conductive layer using a calibration curve formed by relating the magnetic flux density change to thickness of a conductive layer disposed in the magnetic field. The calibration curve either fits a smooth function interpolation to a plurality of calibration points or connects the plurality of calibration points with a plurality of functions.

In certain embodiments, a method of calibrating an eddy current sensor comprises generating a magnetic field, measuring an argument of impedance when each of a plurality of wafers comprising conductive layers having known thicknesses are passed therethrough, forming a calibration curve fitting the measured arguments of impedance to the known thicknesses. The calibration curve comprises either an analytic function having infinite order terms or a continuous piecewise function.

In certain embodiments, a method of determining a thickness of a conductive layer on a workpiece comprises using an eddy current sensor to measure a value when the conductive layer on the workpiece is in a magnetic field and calculating the thickness of the conductive layer using a calibration curve that correlates thickness to the measured value. The calculated thickness is within 5% error over a range from about 1 kÅ to about 20 kÅ.

In certain embodiments, an apparatus for determining thickness comprises an eddy current sensor calibrated to measure a magnetic flux density change when a conductive layer on a workpiece is in a magnetic field and a processor configured to execute a program that transforms the measured magnetic flux density change into a calculated thickness of the conductive layer. The program comprises a calibration curve fit to a plurality of calibration points. The calibration curve comprises either a smooth function interpolation or a piecewise function.

For purposes of summarizing the invention and the advantages achieved over the prior art, certain objects and advantages of the invention are described herein. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular embodiment(s) disclosed.

BRIEF DESCRIPTION OF THE DRAWINGS

These and other features, aspects, and advantages of the invention disclosed herein are described below with reference to the drawings of preferred embodiments, which are intended to illustrate and not to limit the invention.

DETAILED DESCRIPTION OF CERTAIN EMBODIMENTS

A chemical mechanical polishing ("CMP") process can thin a layer on a semiconductor substrate, such as a wafer, and remove projections and imperfections by contacting the layer with a polishing surface (e.g., a pad) and a slurry, which typically contains abrasive particles. Relative motion between the wafer and the polishing surface is provided at a selected rate, pressure, temperature, etc., which may be controlled to yield a layer having a desired thickness. While embodiments may be described with respect to certain CMP tools and process techniques, the skilled artisan will appreciate that the measurement techniques disclosed herein have applications to stand alone or ex situ measurement stations or other types of processing tools.

Figure 1:
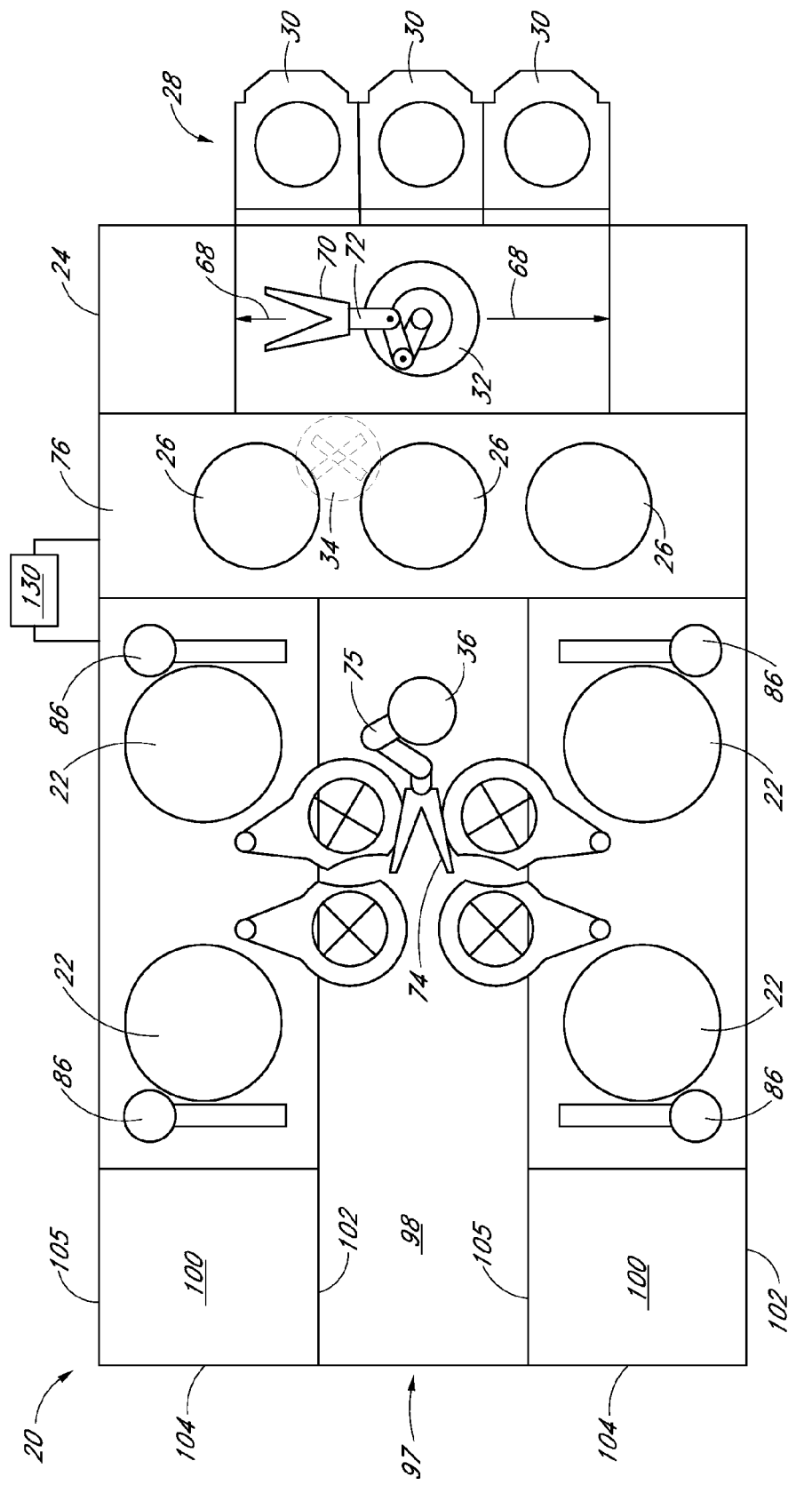
FIG. 1 is a schematic plan view of an example embodiment of an orbital chemical mechanical polishing tool.

FIG. 1 illustrates a CMP apparatus 20 that combines a plurality of CMP systems 22 in a work efficient and space efficient manner. Preferably, the CMP systems 22 are arrayed in two rows spaced apart by a service access corridor 98. The CMP apparatus 20 includes a front end module 24 that includes a cleaning module 76 having a plurality of cleaning stations 26 arrayed along a line at the end of, and substantially perpendicular to, the rows of CMP systems 22. In such a CMP apparatus 20, a plurality of semiconductor wafers can be polished in parallel in the CMP systems 22, and then can be cleaned in parallel in the cleaning stations 26. Although four CMP systems 22 and three cleaning stations 26 are illustrated, the CMP apparatus 20 can include a greater or lesser number of either.

The front end module is further configured to include a wafer cache station 28 that can accommodate a plurality of individual wafer caches 30, such as a cassette or front opening unified pod (FOUP) receiver. The cassette/FOUP receiver 30 is configured to receive cassettes/FOUPS housing one or more workpieces. A front end or "dry" robot 32 (configured to handle dry workpieces) is located in the front end module and employed to transfer a selected wafer from a selected wafer cache 30 to a wafer hand off station 34. A transfer or "wet" robot 36 (configured to handle wet workpieces), positioned between the two rows of CMP systems 22, retrieves the selected wafer from the hand off station and transfers it to a selected one of the plurality of CMP systems 22. In some embodiments, the transfer robot 36 includes a transfer load cup (TLC) configured to transport the workpiece or substrate among the polishing stations CMP systems 22. In certain embodiments, each CMP system 22 is configured to operate independently from the others and may be configured to perform specific functions of the CMP process, such as, but not limited to, having separate stations for sequential non-selective (fast) copper removal, (slower) selective copper removal, and barrier layer removal. In certain alternative embodiments, two or more of the CMP systems 22 are configured to operate together, for example to sequentially operate on some workpieces.

A slurry container (not shown) may be externally or internally associated to supply CMP slurry to the CMP systems 22 through at least one supply channel (not shown). Multiple different CMP slurries may be used. CMP slurries may be supplied to a workpiece via any one of numerous conventionally used methods. For example, a CMP slurry can be supplied to a polishing platen for a through-the-pad polishing system. For another example, CMP slurry can be supplied to a workpiece holder for systems in which the slurry is dispensed onto the workpiece surface. In a third example, CMP slurry can be supplied onto the top surface of the polishing pad from a dispenser located on the system 104. In some embodiments, the CMP slurry comprises an electrolyte that can be plated onto the workpiece.

The selected wafer is polished at the selected CMP system 22. Upon completion of the polishing operation, the wafer is transferred by the transfer robot 36 from the selected CMP system 22 to another of the CMP systems 22 for further processing, or is transferred to a selected one of the plurality of cleaning stations 26 for cleaning. When the cleaning operation is completed, the front end robot 32 transfers the now planarized and cleaned wafer to one of the wafer caches 30. As used herein, the terms "unprocessed wafer" or "unprocessed workpiece" shall refer to a wafer or workpiece prior to a CMP operation, and the terms "processed wafer" or "processed work piece" shall refer to a wafer or workpiece after a CMP operation. In certain embodiments, the CMP apparatus 20 includes at least one controller 130 that is in communication with the CMP systems 22 and/or the cleaning stations 26 and that is configured to operate the CMP systems 22 and/or the cleaning stations 26.

Figure 2A:
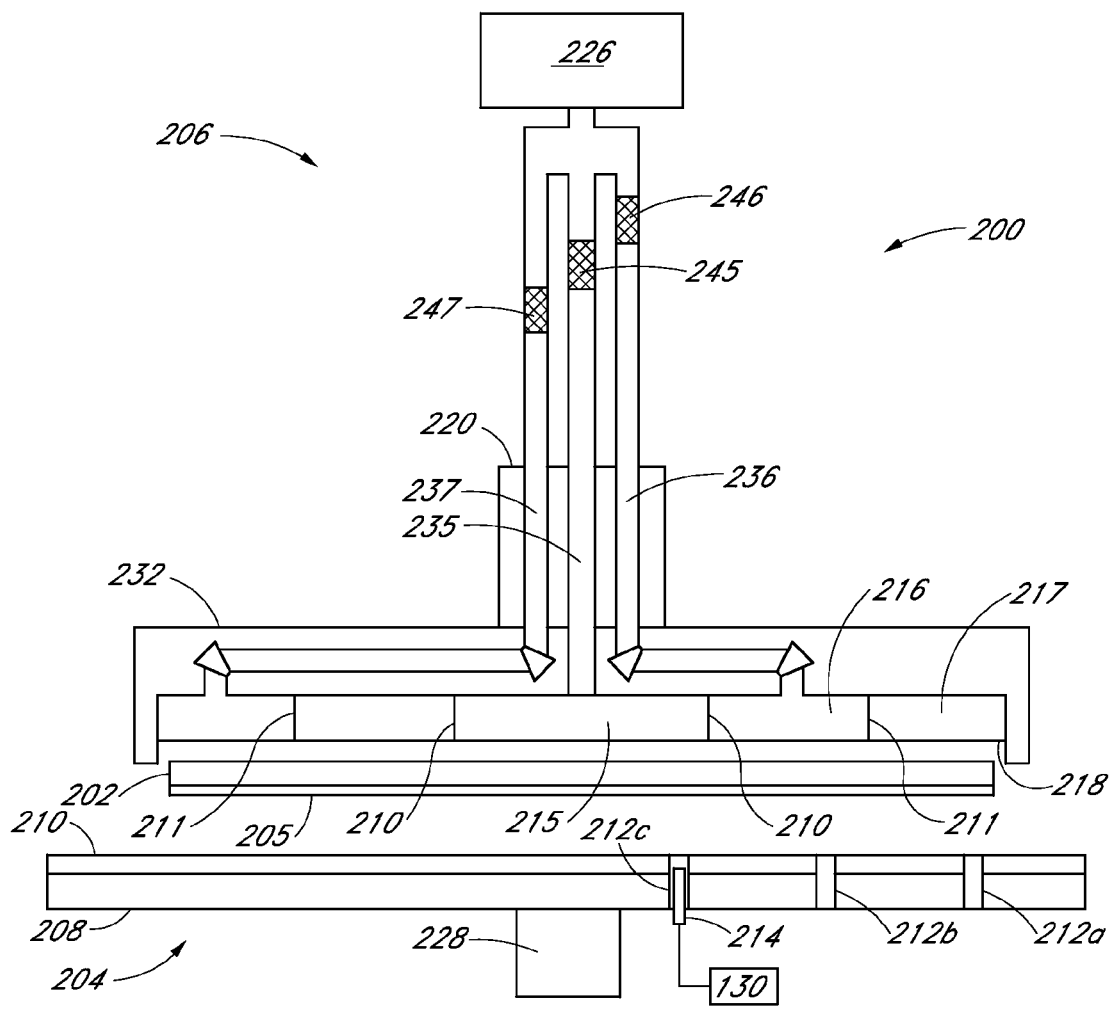
FIG. 2A is a cross sectional side view of an example embodiment of a polishing station that may be implemented into the tool of FIG. 1.

FIG. 2A illustrates a cross sectional side view of an example embodiment of a polishing station 200 that may be incorporated into the CMP apparatus 20 as any one or all of the CMP systems 22. The polishing station 200 is configured to polish a workpiece 202, which may include an exposed conductive layer 205 and other layers (not shown). The polishing station 200 includes a lower polishing module 204 and a workpiece carrier 206. The lower polishing module 204 includes a platen 208 and a polishing pad 210. The platen 208 may comprise a plurality of stacked manifold layers. The platen 208 can optionally be configured to serve several purposes, including introducing relative motion between the polishing pad 210 and the workpiece 202. In this regard, the platen 208 is coupled to a motor assembly 228 that is configured to move the platen 208 orbitally. Other systems may be configured to move a platen in various directions (e.g., translationally, orbitally, and/or rotationally). The platen 208 may be configured to provide conduits for delivering polishing slurry or other fluids to the top surface of the polishing pad 210 and/or other devices. For example, as depicted in FIG. 2A, the platen 208 includes openings 212a, 212b through which polishing fluid may be dispensed to the polishing surface of the pad 210, although it will be appreciated that polishing fluid may be delivered over the polishing pad 210, through conduits on the tool or the wafer carrier assembly 206, etc.

As mentioned above, the polishing pad 210 is configured to polish the workpiece 202 when the workpiece 202 is urged against the pad 210. The polishing pad 210 may be any type of device conventionally used for polishing workpieces 202, for example a polyurethane polishing pad available from Rohm and Haas of Philadelphia, Pa. The polishing pad 210 has a predetermined initial thickness and is removably coupled to platen 208 such that the polishing pad 210 may be used for a plurality of polishing operations and replaced once the thickness is determined to no longer be satisfactory. In some embodiments, the polishing pad 210 includes a sub-pad.

The workpiece carrier 206 is configured to receive a workpiece 202 and to urge the workpiece 202 against the polishing pad 210 during a polishing process. The carrier 206 applies a vacuum-like force to the back side of the workpiece 202, retains the workpiece 202, moves toward the polishing pad 210 to place the workpiece 202 in contact with the polishing pad 210, releases the vacuum-like force, and then applies a force to the workpiece 202 toward the polishing pad 210. In certain embodiments, the carrier 206 is configured to cause the workpiece 202 to move (e.g., rotationally, orbitally, translationally). The carrier 206 includes a body 220, a retaining ring 232 configured to retain the workpiece 202 during polishing, a bladder or diaphragm 218, and a means for applying pressure to the bladder 218.

The carrier 206 illustrated in FIG. 2A has three concentric zones: a central zone 215, an intermediate zone 216, and a peripheral zone 217. The bladder 218 provides a surface for supporting the workpiece 202. An inner ring 210 provides a barrier for separating the zones 215, 216 and an outer ring 211 provides a barrier for separating the zones 216, 217. While three zones 215, 216, 217 are illustrated in FIG. 2A, any suitable number of zones may be used. The greater the number of zones, the more control over the planarization of the workpiece surface 205 may be exercised. In the workpiece carrier 206 illustrated in FIG. 2A, the means for applying pressure to the bladder 218 is adapted to permit biasing the pressure exerted on different areas of the back surface of the wafer 202 by the zones 215, 216, 217. Areas on the back surface of the workpiece 202 receiving a higher (or lower) pressure will typically increase (or decrease) the removal rate of material from corresponding areas on the front surface 205 of the workpiece 202. Removal rates of material from planarization processes are typically substantially uniform within concentric annular bands about the center of the workpiece 202, but the carrier 206 is preferably capable of exerting different pressures in a plurality of different areas while maintaining a uniform pressure within each area. In addition, the carrier 206 also is able to apply different pressures over different zones 215, 216, 217 on the back surface of the workpiece 202. The pressure within the central 215, intermediate 216, and peripheral 217 zones may be individually communicated through passageways 235, 236, 237, respectively, by controllable pressure regulators 245, 246, 247, respectively, each connected to a pump 226. A rotary union 220 may be used to communicate pressure from the pump 226 to each of the pressure regulators 245, 246, 247, and thus to their respective zones 215, 216, 217 if the carrier 206 is rotated. Thus, each concentric zone 215, 216, 217 may be individually pressurized to create three concentric bands to press against the back surface of the workpiece 202. Each zone 215, 216, 217 may therefore have a different pressure, but each concentric band will therefore have a uniform pressure within the band to press against the back surface of the workpiece 202.

The bladder 218 provides a vacuum-like force when the carrier 206 is contacted to the workpiece 202 to retain the workpiece 202, and is configured to provide a controlled pressure across a backside of the workpiece 202 during a polishing process. In certain embodiments, the bladder 218 comprises a plurality of independently controllable zones. Each zone may be connected to an independent supply of fluid used to pressurize the zones and to apply pressure to the back of the workpiece 202.

In certain embodiments, the CMP apparatus 20 includes a set of electrodes (not shown) configured to electrochemically plate or polish the conductive layer 205 of the workpiece 202, for example as described in co-owned U.S. Pat. No. 6,497,800. When the CMP apparatus (e.g., FIG. 1) is used for electrochemical plating, a first electrode renders the workpiece 202 cathodic with respect to a second electrode such that molecules of metal in an electrolyte solution are deposited on the surface of the workpiece 202. During plating, the polishing pad 210 may be used to polish the deposited conductive material. When the CMP apparatus 20 is used for electrochemical polishing, a first electrode renders the workpiece 202 anodic with respect to a second electrode such that molecules of metal are etched from the surface of the workpiece 202 in an electrolyte solution. During polishing, the polishing pad 210 may be used to planarize the conductive material during removal.

The platen 208 also includes an eddy current probe or sensor 214. The eddy current probe 214 generates a magnetic field that experiences a change in magnetic flux density when a conductive object (e.g., the conductive metal layer 205 on a workpiece 202) is passed therethrough. The magnetic flux change provides measurements that can be plotted on an impedance plane. The data points of the impedance plane are typically represented as (x,y) coordinates, as described by Equation 1:

$$z = x + i \cdot y \qquad \text{Eq. 1}$$

where x is the real part from the dry resistance and y is the imaginary part influenced by the reactance of the layer, which is a combination of inductance and capacitance. The measurements can be used to determine certain parameters, such as the hardness or density of the workpiece 202, the thickness of the conductive layer 205, and to identify defects in the conductive layer 205.

The eddy current probe 214 may be disposed in any suitable portion of polishing station 200. In some embodiments, the eddy current probe 214 is disposed in an opening 212c in the platen 208, as illustrated in FIG. 2A. In certain alternative embodiments, the eddy current probe 214 is disposed adjacent and proximate to the platen 208. Additionally, although a single eddy current probe 214 is depicted in FIG. 2A, it will be appreciated that a plurality of eddy current probes 214 may be disposed in a plurality of positions to measure different zones of the workpiece 202. The probes 214 may be mounted in a variety of positions with respect to the pad 210 (e.g., flush with the pad, under the pad, under a sub-pad, etc.).

Figure 2B:
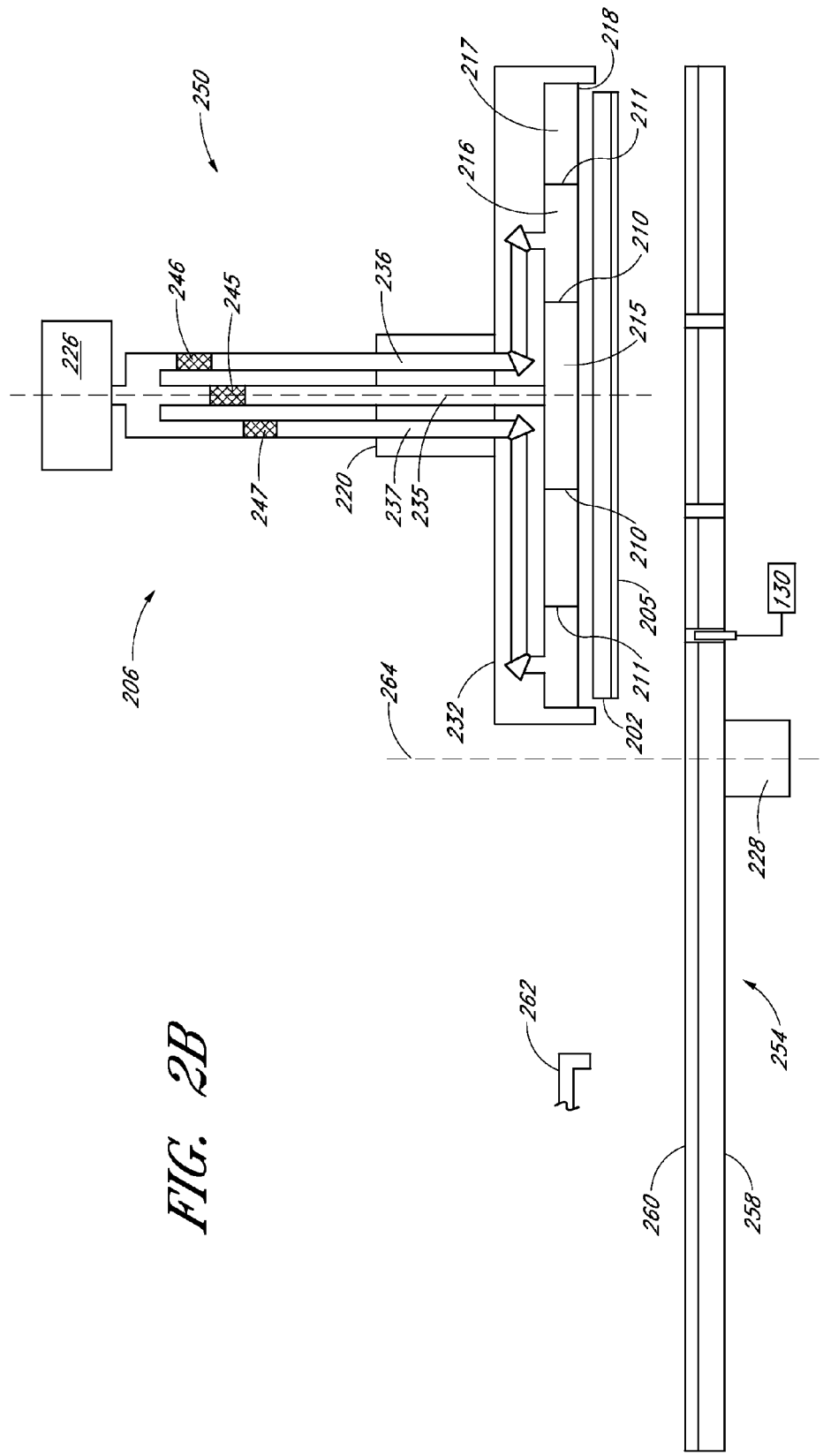
FIG. 2B is a cross sectional side view of another example embodiment of a polishing station that may be implemented into the tool of FIG. 1.

FIG. 2B illustrates a cross sectional side view of another example embodiment of a polishing station 250 that may be incorporated into the CMP apparatus 20 as any one or all of the CMP systems 22. The polishing station 250 is configured to polish a workpiece 202, which may include an exposed conductive layer 205 and other layers (not shown). The polishing station 250 includes a lower polishing module 254 and a workpiece carrier 206, for example as described above with respect to FIG. 2A. The lower polishing module 254 includes a platen 258 and a polishing pad 260. The platen 258 can optionally be configured to serve several purposes, including introducing relative motion between the polishing pad 260 and the workpiece 202. In this regard, the platen 258 is coupled to a motor assembly 228 that is configured to rotate the platen 258. In certain embodiments, the pad 260 and platen 258 supporting the pad 260 are at least twice the diameter of the workpiece 202. In certain modes of operation, the platen 258 rotates about the axis 264, and the carrier 206 rotates about the axis 266 such that the workpiece 202 traces a circular path around the pad 260. The platen 258 may be configured to provide conduits for delivering polishing slurry or other fluids to the top surface of the polishing pad 260 and/or other devices. For example, as depicted in FIG. 2B, the platen 258 includes openings 212a, 212b through which polishing fluid may be dispensed to the polishing surface of the pad 260. For another example, a slurry dispenser 262 may be disposed above the pad 260. Other fluid delivery systems are also possible.

Figure 3A:
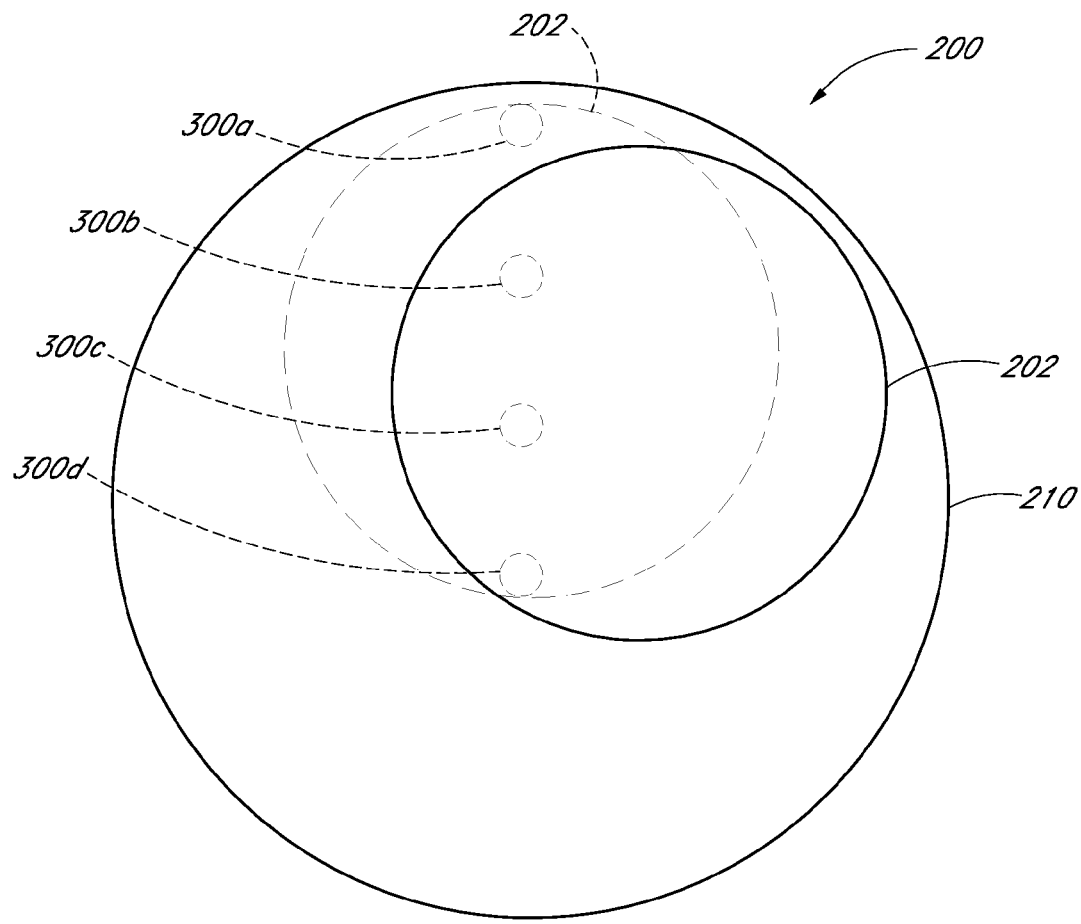
FIG. 3A is a schematic plan view of a wafer, polishing pad, and eddy current sensors for use in a polishing station of the type shown in FIG. 2A.

FIG. 3A illustrates a top plan view of an embodiment of a polishing station 200 in which a workpiece 202 is disposed on a polishing pad 210. A plurality of eddy current sensors 300a, 300b, 300c, 300d are positioned below, and generally in fixed relation to, the polishing pad 210 (e.g., within the platen 208 of FIG. 2A). As the workpiece 202 and the polishing pad 210 are moved relative to each other, the sensors 300a, 300b, 300c, 300d are able to detect a change in magnetic flux density at different positions on the workpiece 202. For example, in the original position of the workpiece 202, represented by a solid line, the sensor 300a at the periphery of the pad 210 does not produce a reading of the workpiece 202, but if the workpiece 202 is moved to the position of the dashed line, the sensor 300a produces a reading based on the thickness of the conductive layer 205 at the edge of the workpiece 202.

Figure 3B:
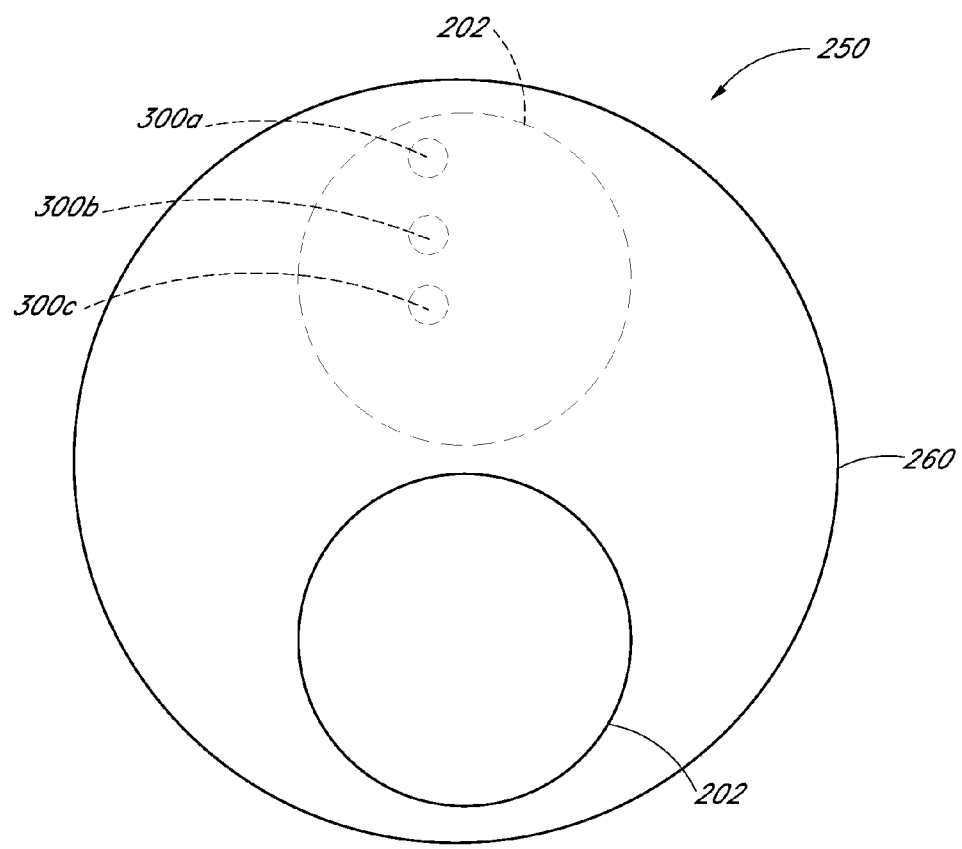
FIG. 3B is a schematic plan view of a wafer, polishing pad, and eddy current sensors for use in a polishing station of the type shown in FIG. 2B.

FIG. 3B illustrates a top plan view of another embodiment of a polishing station 200 in which a workpiece 202 is disposed on a polishing pad 260. A plurality of eddy current sensors 300a, 300b, 300c, are positioned below, and generally in fixed relation to, the polishing pad 260 (e.g., within the platen 258 of FIG. 2B). As the workpiece 202 and the polishing pad 260 are moved relative to each other, the sensors 300a, 300b, 300c, are able to detect a change in magnetic flux density at different positions on the workpiece 202. For example, in the original position of the workpiece 202, represented by a solid line, none of the sensors 300a, 300b, 300c produce a reading of the workpiece 202, but if the workpiece 202 is moved to the position of the dashed line, all of the sensors 300a, 300b, 300c produce a reading based on the thickness of the conductive layer 205. Depending on the speed of rotation of the lower polishing module 254, the sensors 300a, 300b, 300c may only be beneath the workpiece 202 for a fraction of the polishing time. In certain such systems, data from the sensors 300a, 300b, 300c may be sparse compared to the embodiment illustrated in FIG. 3B (in which three sensors can continuously produce data), although appropriate sampling rates may still be used to determine thickness of the conductive layer 205 of the workpiece 202.

In order to correlate a single value for the two impedance coordinates, the variables x, y provided by an eddy current sensor to a thickness of a conductive layer, the modulus of impedance, as described by Equation 2, may be used.

$$|z|=\sqrt{x^2+y^2} \quad \text{Eq. 2}$$

Accordingly, a single value for a modulus of impedance |z| may be calculated for a given conductive layer thickness. However, a single thickness may not always be calculable for a given modulus of impedance |z| because the thickness is not a monotonic function of the modulus of impedance |z| over a broad thickness range, nor is the thickness a monotonic function of the natural log of the modulus of impedance ln |z| (i.e., for any given modulus |z|, there may be two or more corresponding possible thicknesses).

Figure 4:
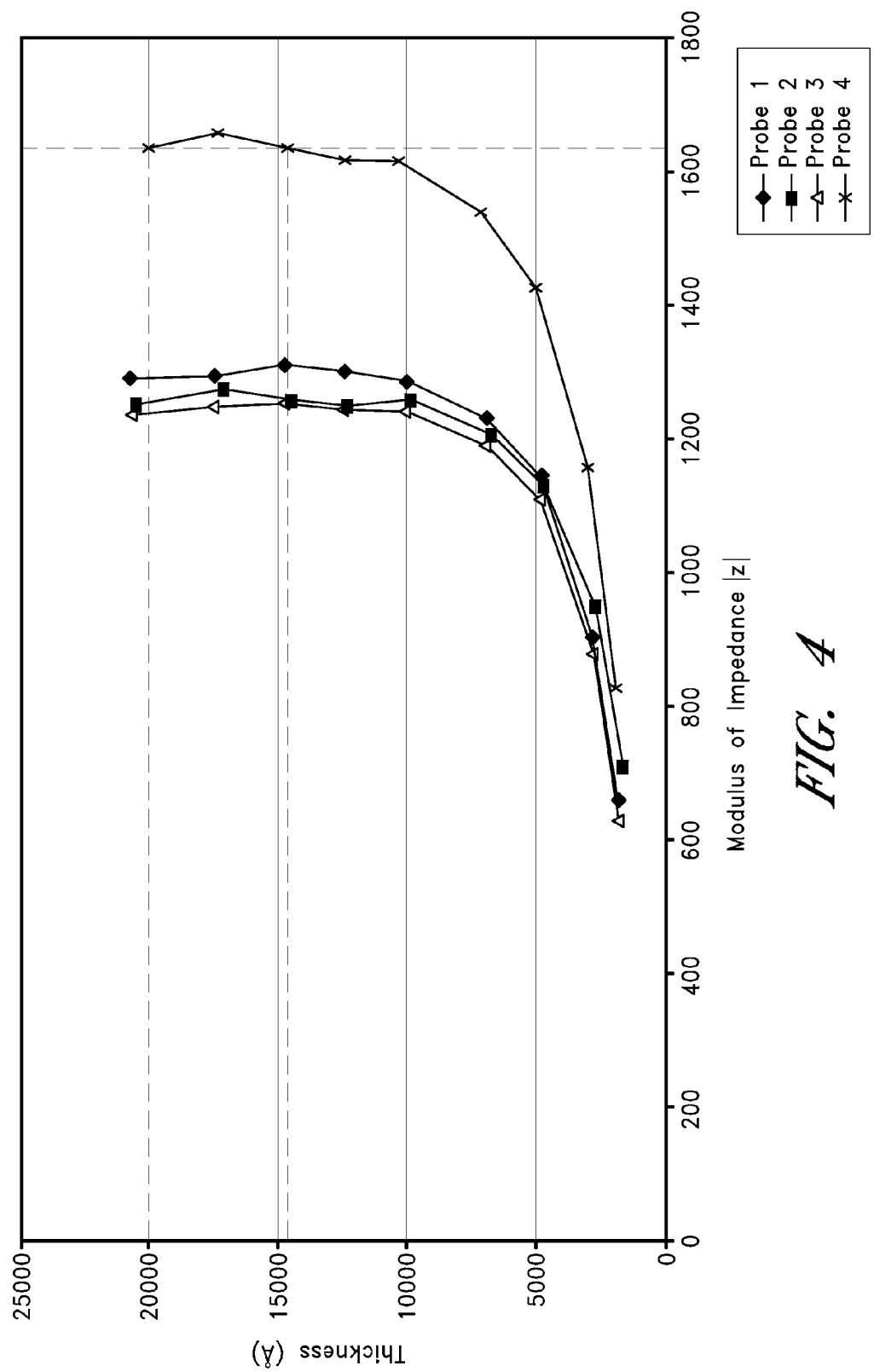
FIG. 4 is an example plot of calculated thickness versus the modulus of impedance.

FIG. 4 is an example plot of calculated thickness versus modulus of impedance |z| for four eddy current probes (e.g., the probes 300a, 300b, 300c, 300d). Each of the plots has portions in which a plurality of thicknesses can be calculated from a single measurement of modulus of impedance |z| due to the non-monotonic nature of the correlation. As such, calculating a thickness based on a measurement of modulus of impedance |z| can be challenging or impossible. For example, a modulus of impedance |z| of about 1650 as measured by Probe 4 could result in a thickness of about 14.5 kÅ or a thickness of about 20 kÅ, a difference of about 38%. Accordingly, the modulus of impedance |z| generally cannot be used to provide accurate thickness data, especially over a large range of thicknesses.

The thickness is also not a monotonic function of either the dry resistance x or the reactance y, and thus using only one of the variables may have similar accuracy issues. However, the disclosure below takes advantage of the realization that thickness is a monotonic function of the argument of z (i.e., the phase angle θ represented in Equation 3), and therefore can be used to correlate impedance values x and y measured by an eddy sensor to a unique thickness value.

$$\theta = \tan^{-1}\left(\frac{y_b}{x_b}\right) \quad \text{Eq. 3}$$

where the subscript b indicates that the raw data has been corrected for the zero-error, commonly called the "balanced data" after balancing the sensors as follows:

$$z=Re^{i\theta}$$

$$z_{raw}=x_{raw}+i\cdot y_{raw}$$

$$z_0=x_0+i\cdot y_0$$

$$z_b=x_b+i\cdot y_b=(x_{raw}-x_0)+i\cdot(y_{raw}-y_0)$$

where $z_0$ is the impedance measured without any calibration wafer from points $x_0$ and $y_0$, which are subtracted from the measured impedance values $x_{raw}$ and $y_{raw}$ to result in the balanced impedance values $x_b$ and $y_b$. The argument of impedance θ can then be accurately calculated by determining the arctangent of the ratio of the balanced values $y_b$ to $x_b$. Calibration using two or more points and linear or polynomial curve fitting can correlate the measured impedance to known or measured thicknesses.

Figure 5:
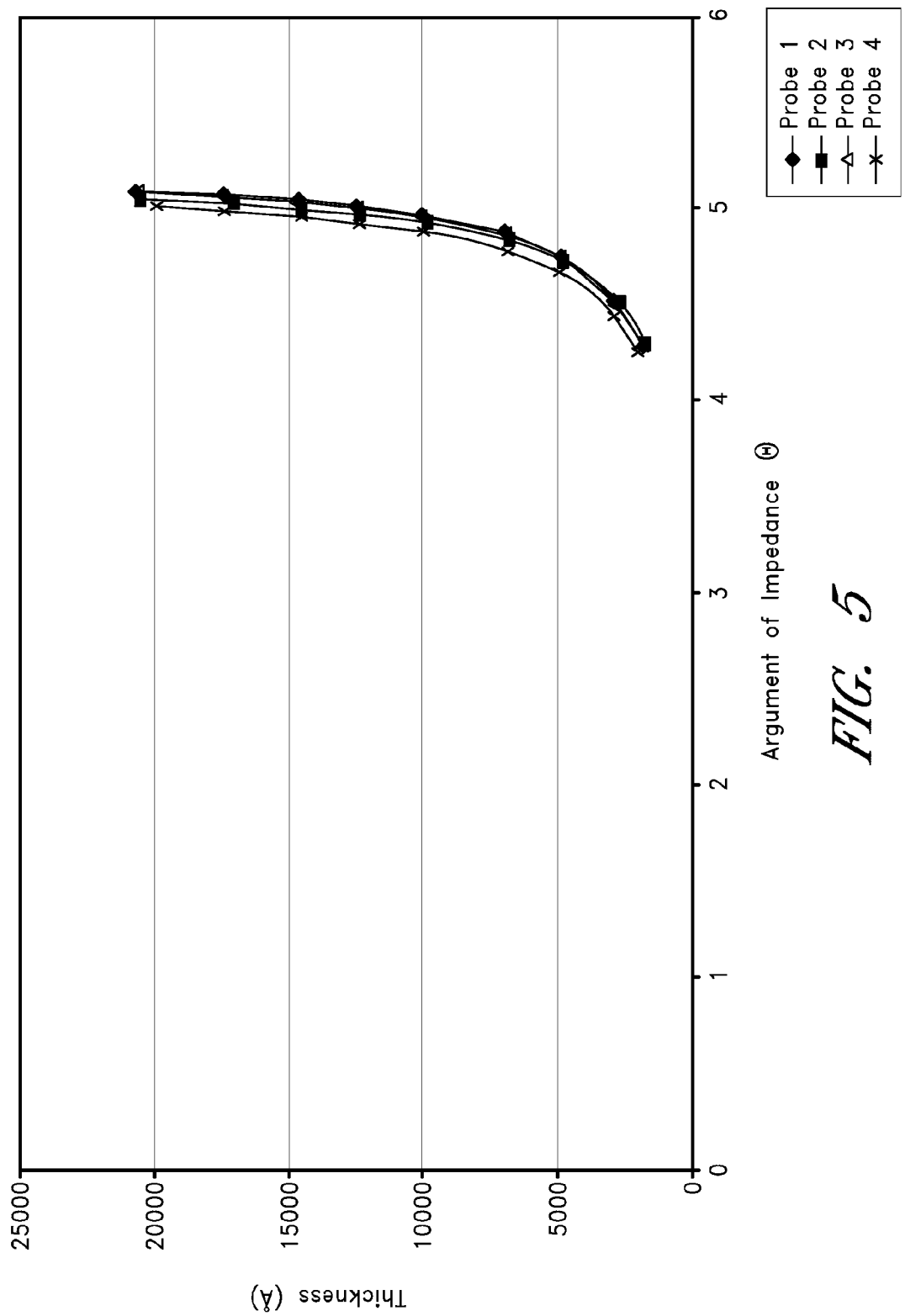
FIG. 5 is an example plot of calculated thickness versus argument of impedance $\theta$.

FIG. 5 is an example plot of calculated thickness versus "measured" argument of impedance θ, calculated from the impedance measured by four eddy current probes (e.g., the probes 300a, 300b, 300c, 300d). All of the probe measurements show monotonic variation of the argument of impedance θ with thickness over a large range of thickness values. Thus, a one-to-one mapping between thickness and the argument of impedance θ can be established. The mapping can be used to calibrate the sensors, thereby enabling the sensors to work over a large range of thicknesses.

Eddy current measurements can be correlated to measured or known thicknesses based on the phase angle or argument θ, but a mathematical relation between the calibration measurements is needed for interpolation or extrapolation. For typical engineering calibrations, the most commonly used curve fits to the data are linear and polynomial curve fits. However, they cannot be used reliably for fitting the modulus of impedance over large thickness ranges because there may be a large amount of error between the calibration points, particularly at low and high thicknesses. The correlation may be tightened by using higher order polynomials (e.g., up to the fifth power), but higher order polynomials also induce higher error as a result of fitting each of the calibration points. In certain systems, the amount of error is acceptable for layers having a relatively small thickness range (e.g., between about 1 kÅ and about 10 kÅ), but the error can be about 15% or more when the thickness range is expanded (e.g., to less than about 500 Å and greater than about 20 kÅ) due to poor fit by the calibration curve.

Figure 6A:
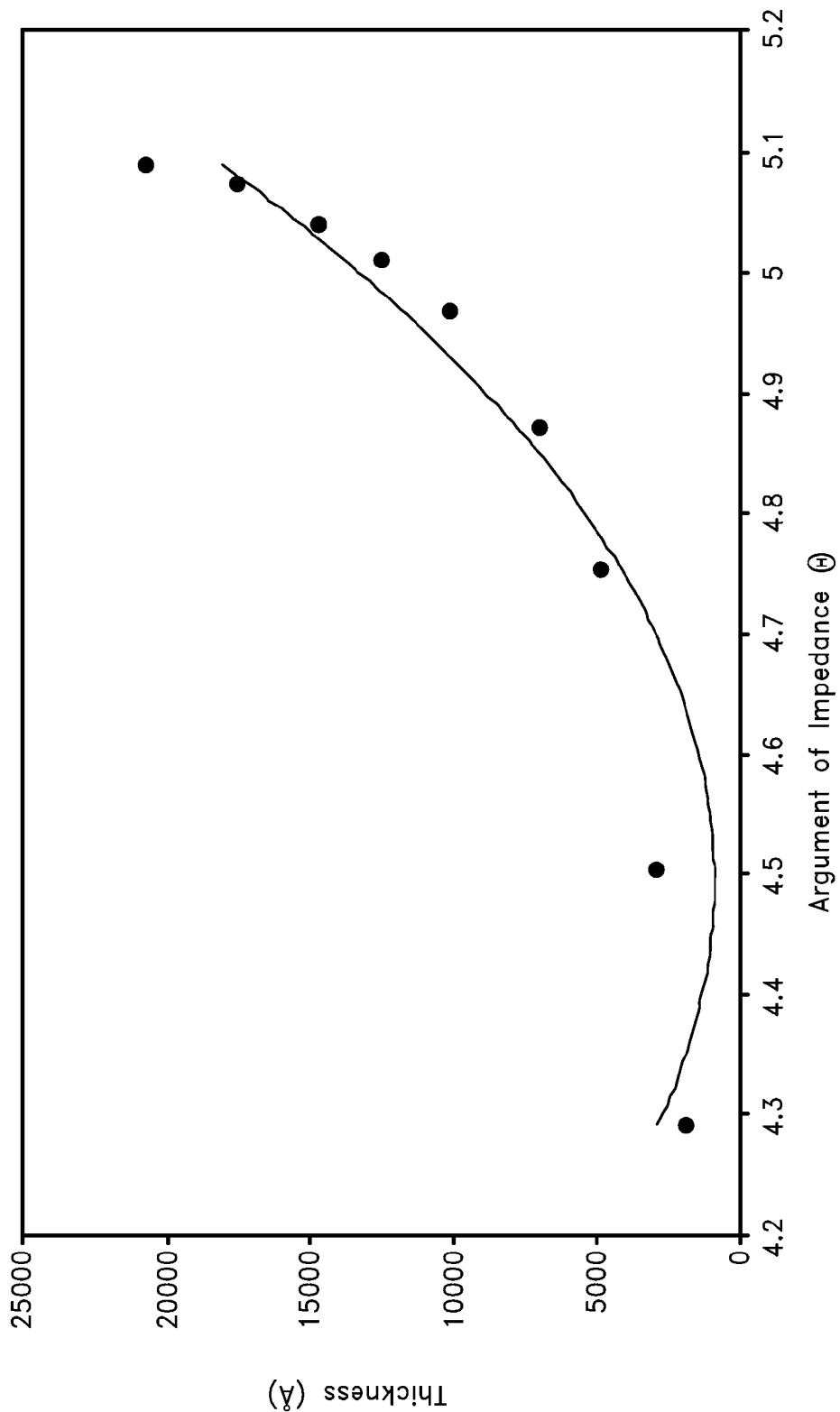
FIGS. 6A-6E are example plots of modeled thicknesses and actual thicknesses versus argument of impedance $\theta$ using various orders of polynomials for modeling.
Figure 6B:
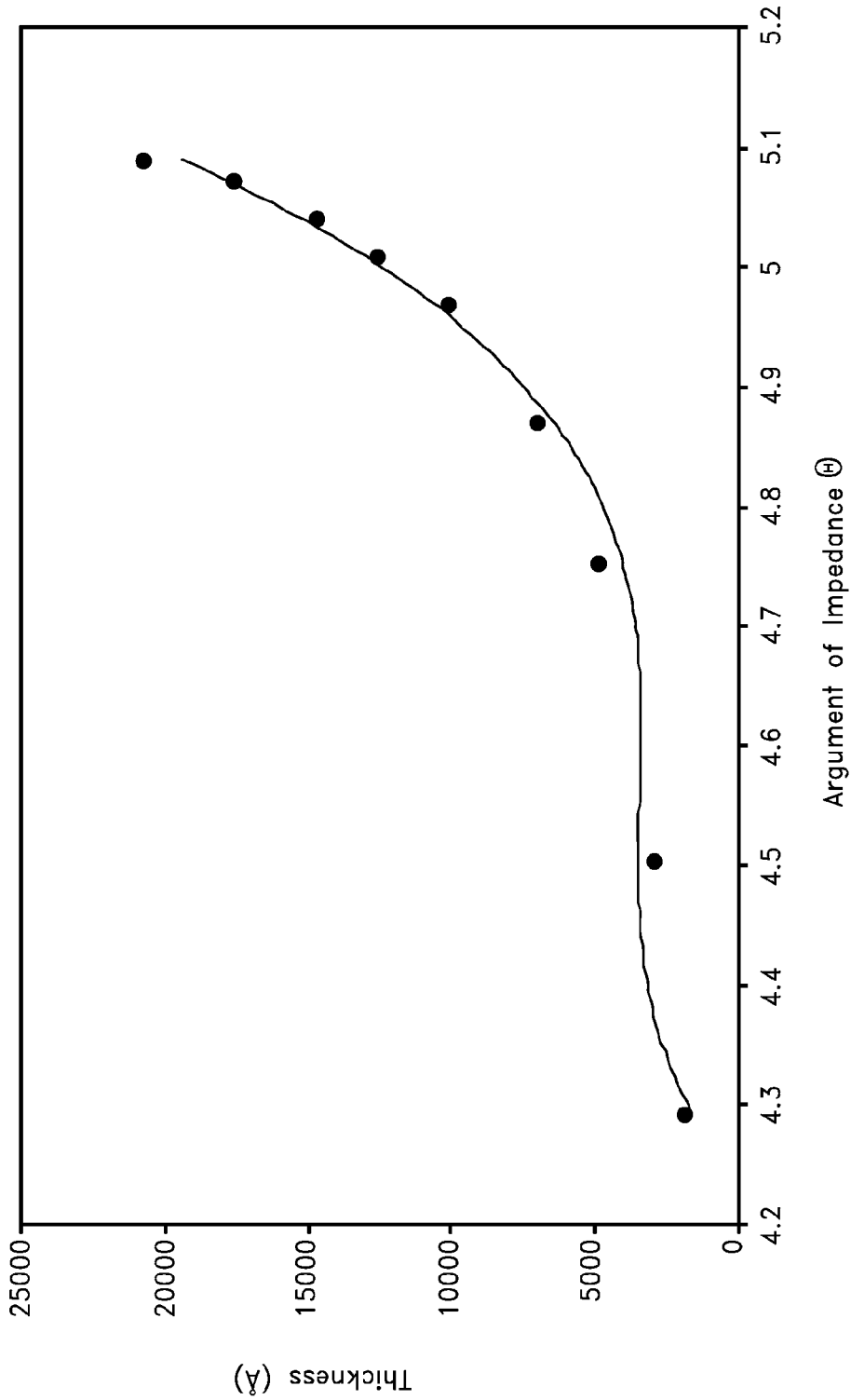
Figure 6C:
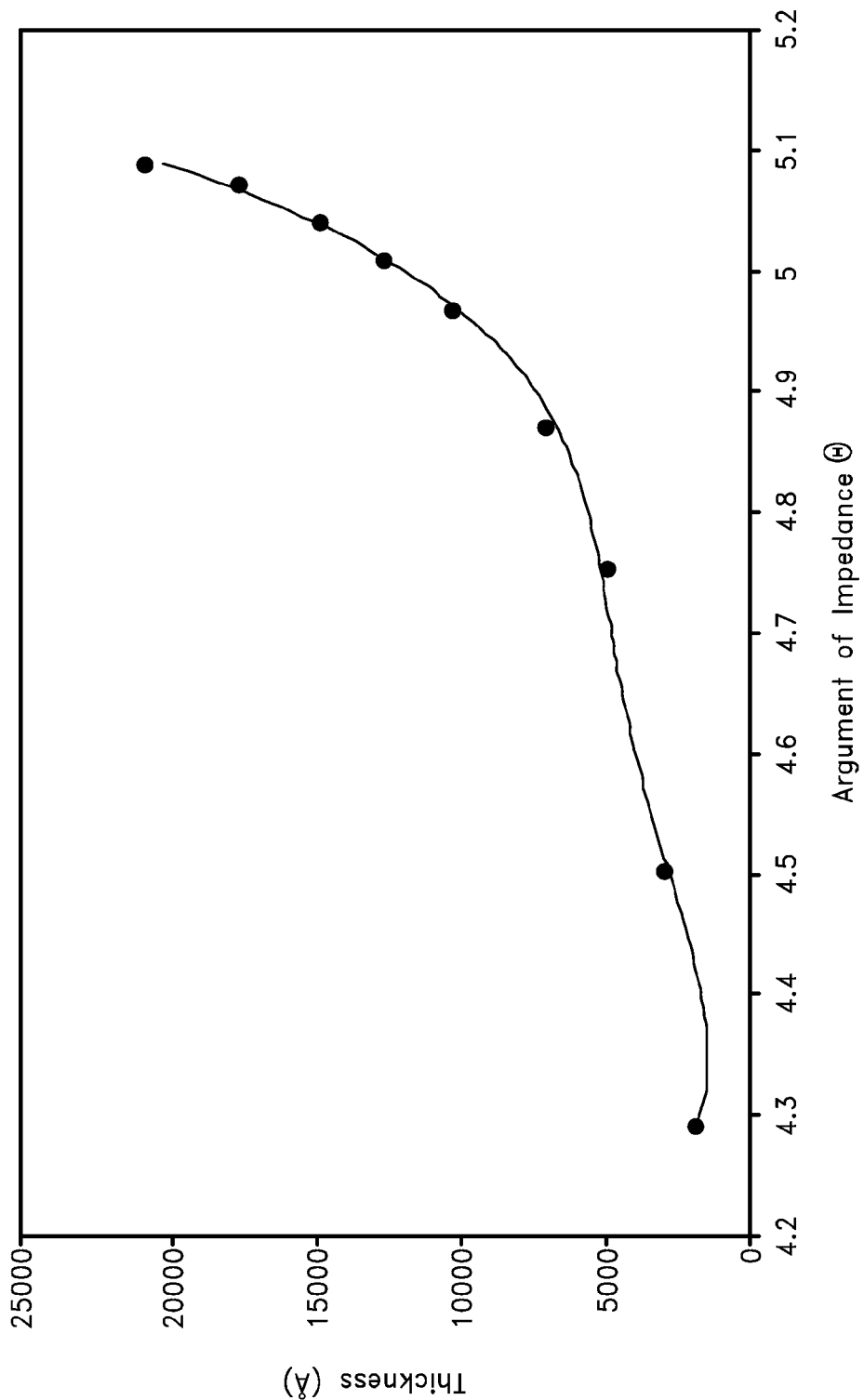
Figure 6D:
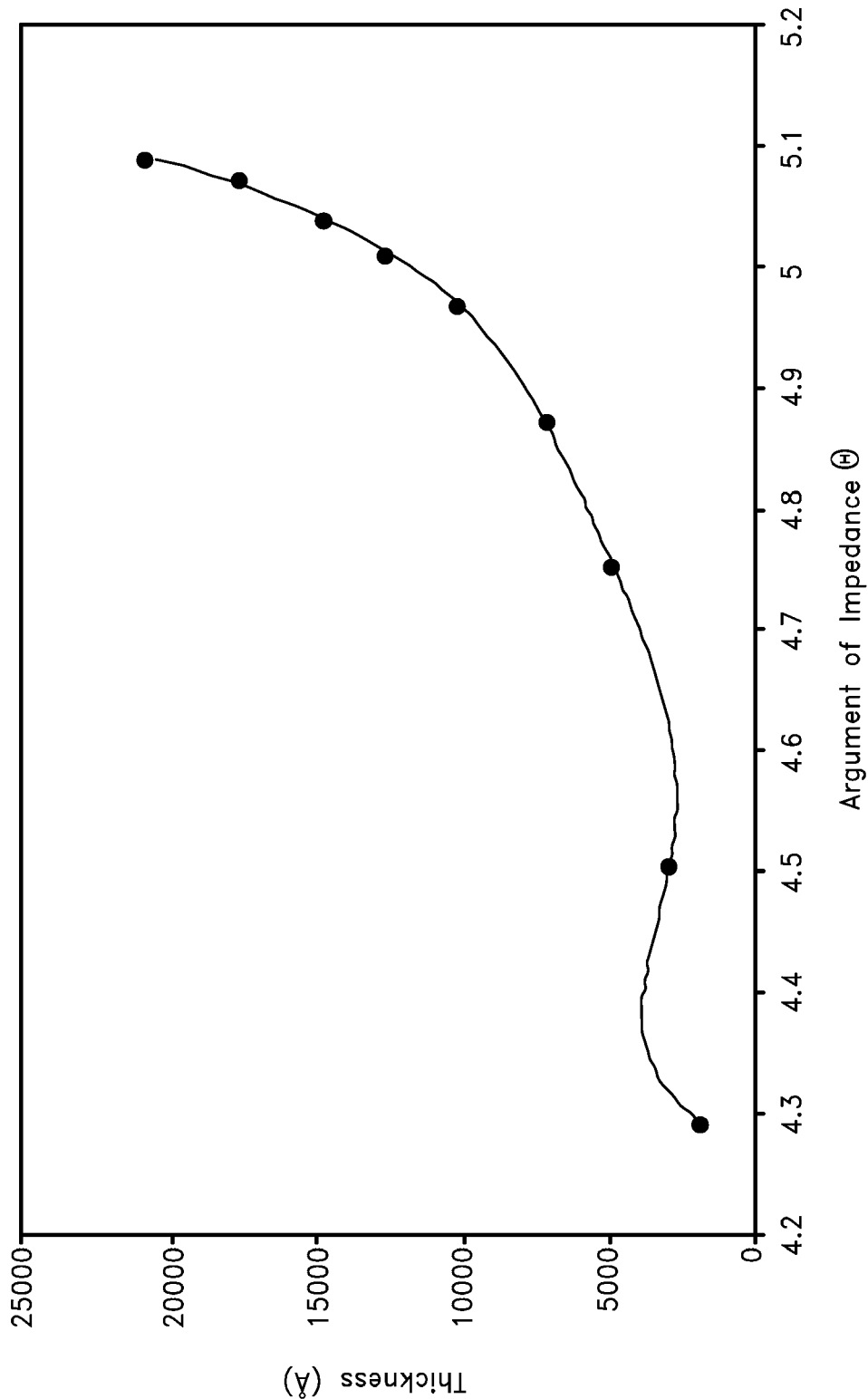
Figure 6E:
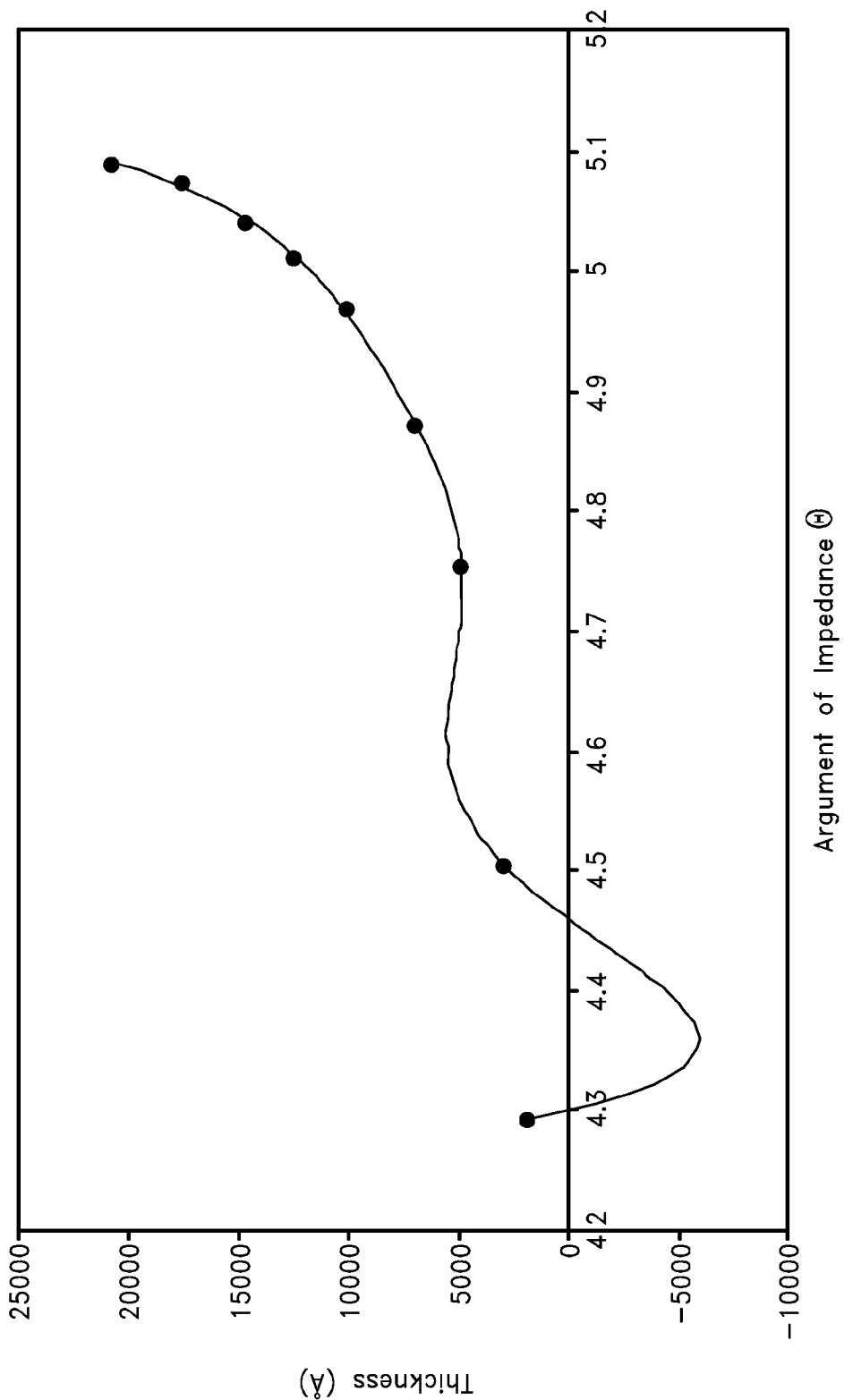

The poor correlation of polynomial calibration curves fit to known or otherwise measured thickness data points is illustrated in FIGS. 6A-6E. FIG. 6A illustrates a second order polynomial calibration curve fit to a set of calibration data, which is represented by the circles. The curve does not fit the data points well at most thicknesses and the error at low thicknesses (e.g., at about 4 kÅ) is extreme. The calculated thickness using the curve to interpolate or extrapolate is only accurate within about 22%, even at the data points representing actually measured thicknesses, and is worst at low thicknesses (i.e., below about 5 kÅ), where the calculated thickness value should desirably be most accurate. FIG. 6B illustrates a third order polynomial calibration curve fit to the same set of calibration data, represented by the circles. The calculated thickness using the curve to interpolate or extrapolate is only accurate within about 9%, even at the actually measured thicknesses, and is again worst at low thicknesses (i.e., below about 5 kÅ), where the calculated thickness value should desirably be most accurate. FIG. 6C illustrates a fourth order polynomial calibration curve fit to the same set of calibration data, represented by the circles. The calculated thickness using the curve to interpolate or extrapolate is accurate within about 4% at the actually measured thicknesses, but can be inaccurate by more than 9% at some low thicknesses (i.e., below about 5 kÅ), where the calculated thickness value should desirably be most accurate. FIG. 6D illustrates a fourth order polynomial calibration curve fit to the same set of calibration data, represented by the circles. The calculated thickness using the curve to interpolate or extrapolate is accurate for the calibration points, but begins to vary wildly from the actual data at low thicknesses (i.e., below about 5 kÅ), where the calculated thickness value should desirably be most accurate. FIG. 6E illustrates a fifth order polynomial calibration curve fit to the same set of calibration data, represented by the circles. The calculated thickness using the curve to interpolate or extrapolate is accurate for the calibration points, but begins to vary even more wildly from the actual data at low thicknesses (i.e., below about 5 kÅ), where the calculated thickness value should desirably be most accurate, even predicting negative thickness values at some phase angle (argument of impedance) measurements. Thus, lower order polynomials fail to fit even calibration data, and higher order polynomials fail to accurately fit the calibration data to a reasonable curve. Accordingly, polynomials in general, and higher order polynomials in particular, are not the solution to producing calibration curves that correctly model thickness based on eddy current measurements.

Additionally, the order of the polynomial is disadvantageously limited by the number of calibration wafers used (i.e., at least four calibration wafers and a non-wafer—or zero—reading are needed to obtain a predictive fifth-order polynomial). Increasing the number of calibration wafers will enable a fit of the calibration curve to a higher number of points, but it becomes more time consuming, thereby decreasing the amount of time the CMP apparatus 20 may use to process production workpieces. Moreover, a combination of high quantities of calibration wafers and a high order polynomial can actually produce large error as the polynomial will fit each calibration point but be wildly inaccurate for interpolations or extrapolations that are not near those actual data points, as illustrated in FIG. 6E.

Smooth Function Interpolation

The present disclosure takes advantage of the realization that minimization of the distance between calibration points and the calibration curve fit can produce less error for interpolations or extrapolations distant from the actual data points used to generate the calibration curve. An appropriate system of functions is expressed by Equations 4-6:

$$t = \sum_j g_j(a_j, \theta) \qquad \text{Eq. 4}$$

$$g_j(a_j, \theta) = a_j \cdot h_j(\theta) \qquad \text{Eq. 5}$$

$$h_j(\theta) = \begin{cases} \theta^{j-1} \\ \sin(\varpi_j, \theta) \\ \sinh(j \cdot \theta) \end{cases} \qquad \text{Eq. 6}$$

where t is thickness, where j is an index variable holding the place of the number of terms, where $g_j(a_j, \theta)$ is any function in which the constants $a_j$ can be separated from the function $h_j(\theta)$, and where the function $h_j(\theta)$ could be any type of analytic function having infinite order terms (e.g., trigonometric, hyperbolic, logarithmic, inverse trigonometric, inverse hyperbolic, inverse logarithmic, combinations thereof, and the like, as expressed in the examples of Equation 6). This excludes purely polynomial functions, which have finite order terms (i.e., the number of terms based on the order of the polynomial). In certain embodiments, the function $h_j(\theta)$ could include a polynomial in combination with an analytic function having infinite order terms (e.g., hyperbolic in combination with a fourth-order polynomial). Embodiments in which the function is hyperbolic sine, (e.g., $h_j(\theta) = \sinh(j \cdot \theta)$), generally can provide good curve fit to eddy current calibration data (e.g., thickness versus argument of impedance $\theta$) because such a function is infinitely differentiable and can thereby accurately capture decay and/or growth.

Once the function $h_j(\theta)$ has been selected for Equation 6, the values of the constants $a_j$ may be calculated. For known thicknesses $t_i$ of i number of wafers, an eddy current sensor can be used to measure the arguments of impedance $\theta_i$ for the known thickness $t_i$ on each wafer i. Moreover, for known arguments of impedance $\theta_i$ and estimates of each value of $a_j$, a reference thickness $t_i^r$ can be calculated for each wafer i, as expressed by Equation 7:

$$t_i^r = \sum_j g_j(a_j, \theta_i) \qquad \text{Eq. 7}$$

The difference between the calculated reference thickness $t_i^r$ and the actual thickness $t_i$ is the error due to using improper values for the constants $a_j$, which is expressed in Equation 8:

$$d_i = t_i - t_i^r \qquad \text{Eq. 8}$$

The sum of the squares of the error in calculated reference thickness $t_i^r$ for each wafer i is expressed by $D^2$ in Equation 9:

$$D^2 = \sum_i d_i^2 \qquad \text{Eq. 9}$$

$$= \sum_i \left[ t_i - \left( \sum_j a_j \cdot h_j(\theta_i) \right) \right]^2$$

The error can be minimized by taking a partial derivative of q terms. When the index j is the same as the index q, the partial derivative is zero, as expressed in Equation 10:

$$\frac{\partial D^2}{\partial a_q} = 0 \qquad \text{Eq. 10}$$

When the index j is different than the index q, the partial derivative is not zero and is used to populate a matrix.

$$\begin{aligned}\frac{\partial D^2}{\partial a_q} &= \frac{\partial}{\partial a_q}\left\{\sum_i \left[t_i - \left(\sum_j a_j \cdot h_j(\theta_i)\right)\right]^2\right\} \\ &= \frac{\partial}{\partial a_q}\left\{\sum_i \left[t_i^2 - 2t_i\left(\sum_j a_j \cdot h_j(\theta_i)\right) + \left(\sum_j a_j \cdot h_j(\theta_i)\right)^2\right]\right\} \\ &= \frac{\partial}{\partial a_q}\left[\sum_i -2t_i\left(\sum_j a_j \cdot h_j(\theta_i)\right)\right] + \frac{\partial}{\partial a_q}\left[\sum_i \left(\sum_j a_j \cdot h_j(\theta_i)\right)^2\right] \\ &= \sum_i -2t_i \frac{\partial}{\partial a_q}\left(\sum_j a_j \cdot h_j(\theta_i)\right) + \sum_i 2\left(\sum_j a_j \cdot h_j(\theta_i)\right)\frac{\partial}{\partial a_q} \\ &\quad \left(\sum_j a_j \cdot h_j(\theta_i)\right)\frac{\partial}{\partial a_q}\left(\sum_j a_j \cdot h_j(\theta_i)\right) \\ &= \sum_j \left(\frac{\partial a_j}{\partial a_q} \cdot h_j(\theta_i)\right) \\ &= \sum_j \delta_{jq} \cdot h_j(\theta_i) \\ &= h_q(\theta_i)\end{aligned}$$

Equation 10 can thus be reduced to:

$$\frac{\partial D^2}{\partial a_q} = \sum_i \left[-2t_i \cdot h_q(\theta_i) + 2\left(\sum_i a_j \cdot h_j(\theta_i)\right) \cdot h_q(\theta_i)\right]$$

The system of Equations 4-10 results in Equations 11-14:

$$[A]\{a\}=\{b\} \qquad \text{Eq. 11}$$

where [A] is a column matrix, where {a} is a square matrix of the constants $a_j$, and where {b} is a square matrix. Each term in the column matrix [A] may be expressed as:

$$A_{qj} = \sum_i h_q(\theta_i) \cdot h_j(\theta_i) \qquad \text{Eq. 12}$$

The thickness $t_i$ is known for each $a_j \cdot h_j(\theta_i)$, so each term $b_q$ in the square matrix {b} may be expressed as:

$$b_q = \sum_i h_q(\theta_i) \cdot t_i \qquad \text{Eq. 13}$$

The result is Equation 14, which is devoid of the index i:

$$A_{qj} \cdot a_j = b_q \qquad \text{Eq. 14}$$

Advantageously, this allows any number i of calibration wafers to be used for functions $h_j(\theta)$ having any number of terms. While more calibration wafers can produce a more accurate function, about five (5) wafers (plus a non-wafer (e.g., "zero") measurement) have been found to be sufficient to determine thicknesses within 5% error over a large range of conductive layer thicknesses when $h_j(\theta)=\sinh(j\cdot\theta)$. In certain embodiments, calibration can be performed using less than 20 wafers, less than 10 wafers, less than 8 wafers, less than 6 wafers, less then 4 wafers, etc.

If the formed matrix is poorly scaled, Equation 15 can be used to precondition the matrix for scaling and normalization.

$$\begin{aligned}t &= \sum_j a_j \cdot h_j(\theta) \qquad \text{Eq. 15}\\ &= \sum_j a_j \cdot h_j(\overline{\theta}) \cdot \left(\frac{h_j(\theta)}{h_j(\overline{\theta})}\right) \\ &= \sum_j \tilde{a}_j \cdot \left(\frac{h_j(\theta)}{h_j(\overline{\theta})}\right)\end{aligned}$$

where $\overline{\theta}$ is the average of the measured arguments of impedance $\theta_i$, as expressed by Equation 16, and where $\tilde{a}_j=a_j\cdot h_j(\overline{\theta})$:

$$\overline{\theta} = \frac{\sum_i \theta_i}{i_{max}} \qquad \text{Eq. 16}$$

However, it will be appreciated that the calculated value of $h_j(\overline{\theta})$ should not be zero or else the normalization would disadvantageously be dividing by zero, leading to an undetermined result. Preconditioning the matrix using an average $\overline{\theta}$ of the measured arguments of impedance $\theta_i$ can make the model more robust to large thickness ranges because it allows scaling of terms that would otherwise diverge.

Those of skill in the art will appreciate that methods described herein may be incorporated into computer code (e.g., into MATLAB® code) to automate determination of the coefficients $a_j$ of the function $g_j(a_j,\theta)$. Referring again to FIG. 2, the eddy current sensor 214 may be in communication with the at least one controller 130, which may include a processor configured to execute a program that transforms a parameter measured by the eddy current sensor 214 (e.g., change in magnetic flux density, argument of impedance θ) into a thickness of the conductive layer 205 in accordance with the smooth function interpolation methods described herein.

Figure 7:
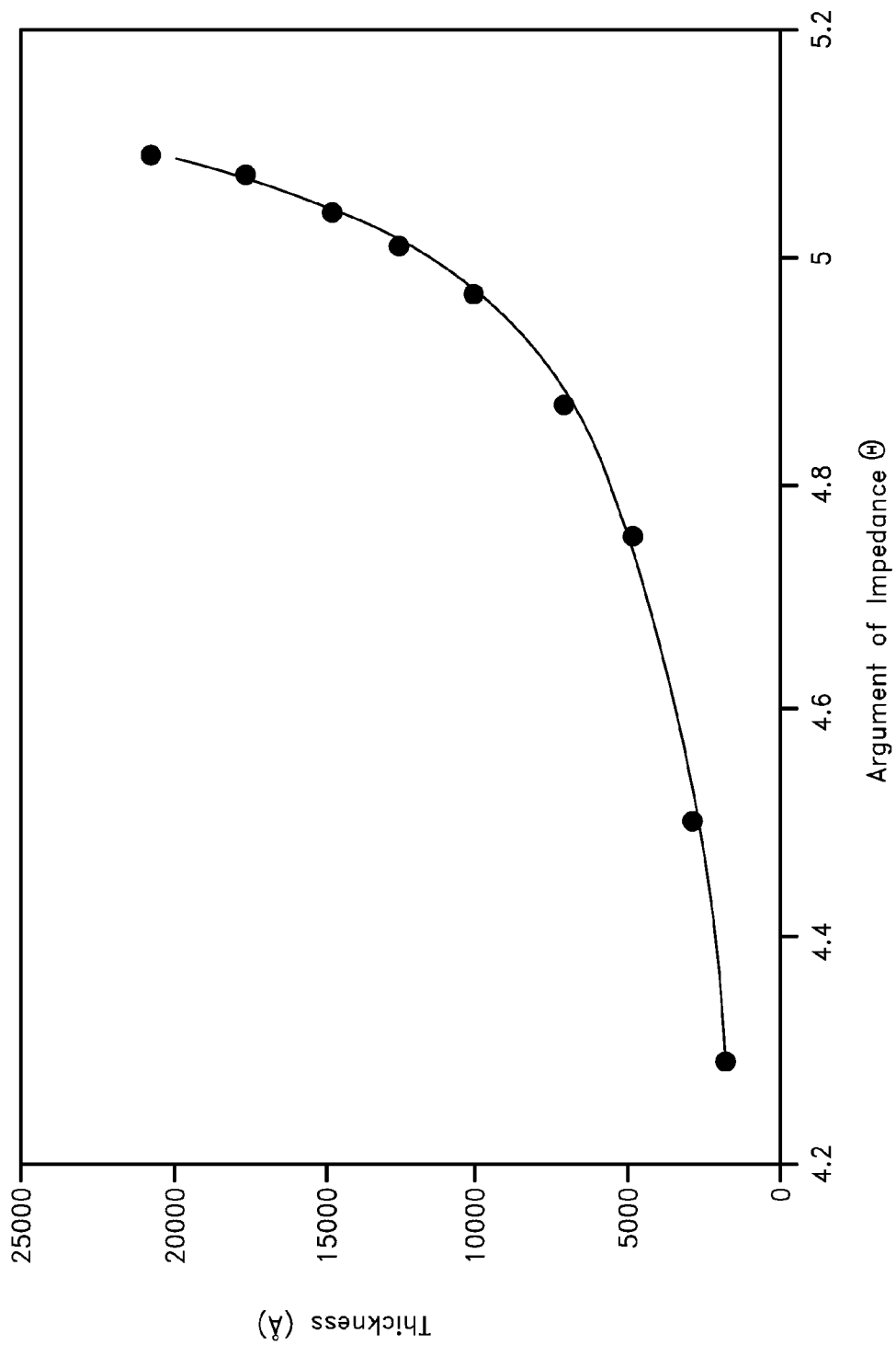
FIG. 7 is an example plot of actual thickness and a modeled thickness function versus argument of impedance $\theta$.

FIG. 7 illustrates how the function $h_j(\theta)=\sinh(j\cdot\theta)$ calibration curve compares to the same calibration data used for FIGS. 6A-6E, again represented by the circles. The calculated thickness using the argument of impedance θ is correlated within about 2% at the actually measured thicknesses, and is also accurate to within about 2% at intermediate (interpolated) thicknesses, including low amounts of error at low and high thicknesses (i.e., at about 1.8 kÅ and at about 20 kÅ), where the calculated thickness value should desirably be most accurate. In certain embodiments, the calibration is advantageously stable at about zero thickness. In certain such embodiments, accuracy at about zero thickness may be improved by using an impedance measurement measured on a known thickness of zero (e.g., no calibration wafer or a calibration wafer free of a conductive layer) in the calibration.

Figure 8:
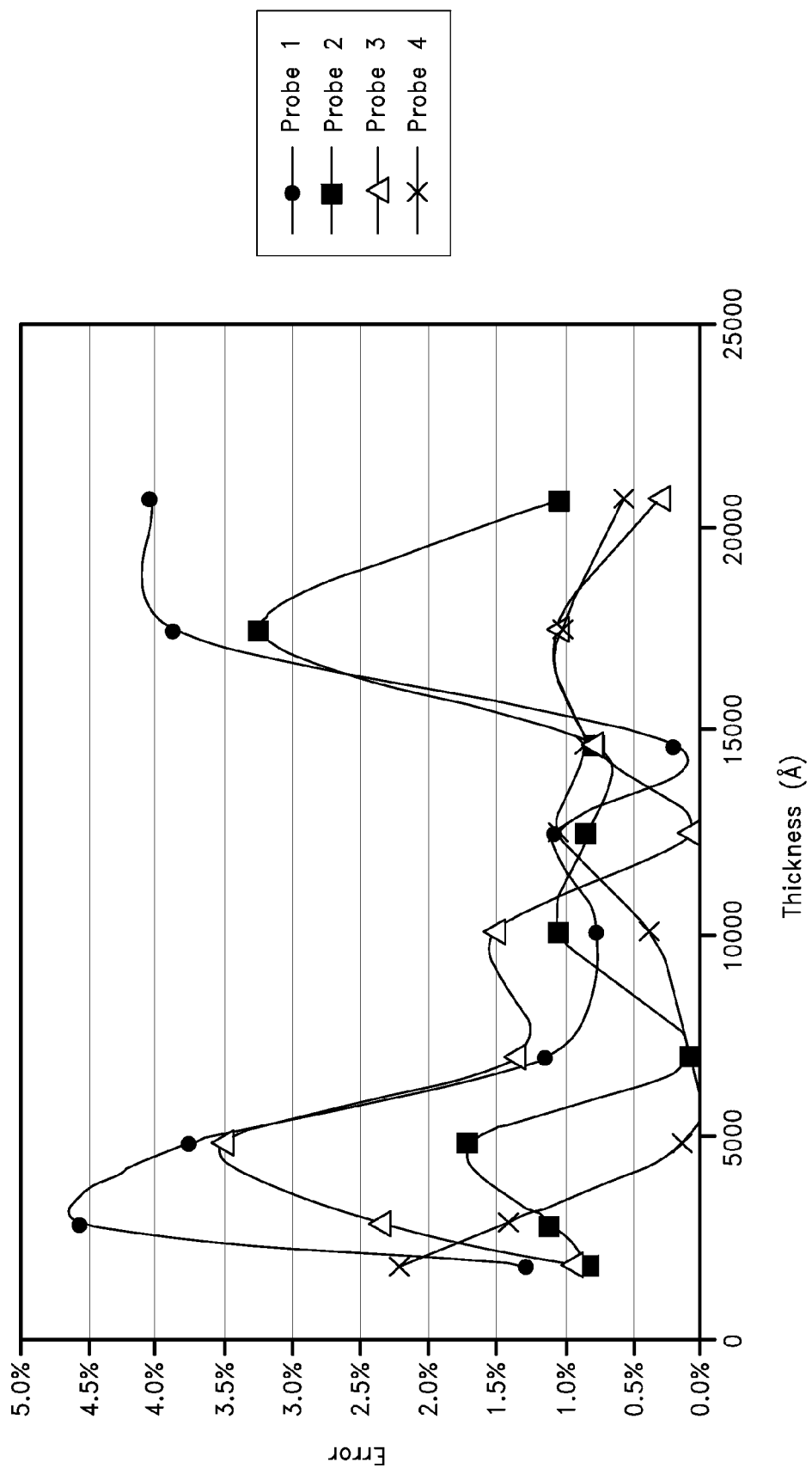
FIG. 8 is an example plot of thickness measurement error using a modeled thickness function.

FIG. 8 illustrates the amount of conductive layer thickness measurement error using a plurality of eddy current probes calibrated with a hyperbolic analytic function on wafers having known thicknesses from about 1.8 kÅ to about 21 kÅ. Certain probes may have different amounts of error based on their location on the workpiece 202 (e.g., the first probe or sensor 300a may have more error than the second probe or sensor 300b because the sensor 300a may be off the workpiece 202 or measuring only the edge, while the sensor 300b generally measures a central region of the workpiece 202) or due to inherent probe differences. In accordance with the method discussed above, the eddy current measurements were translated into arguments of impedance θ for each calibration wafer, the data was normalized using an average value $\bar{\theta}$ of the arguments of impedance $\theta_i$, and a matrix was assembled to determine the constants $a_j$. The arguments of impedance θ were then measured for a plurality of wafers using the same eddy current sensors, and the actual thickness was compared to the calculated thickness. The error for thicknesses calculated from sinh(j·θ) as determined by eddy current calibration measurements from all probes at all thicknesses within the measured range was less than about 5%, with a maximum standard deviation of 1.7% on the worst performing probe (Probe 1).

Piecewise Continuous Interpolation

As described above, embodiments take advantage of the realization that minimization of the distance between calibration points and the calibration curve fit can produce less error for points along the curve outside the calibration data points (interpolated or extrapolated). The distance between calibration points can actually be reduced to zero (i.e., 0% error at the calibration points) by using a plurality of functions between the calibration points and the calibration curve. Together, the plurality of functions form a "piecewise continuous interpolation" because they provide a calibrated value for thickness at all points within the calibration region. Additionally, certain functions can be chosen such that an extrapolation beyond the calibration range is also accurate.

Figure 9:
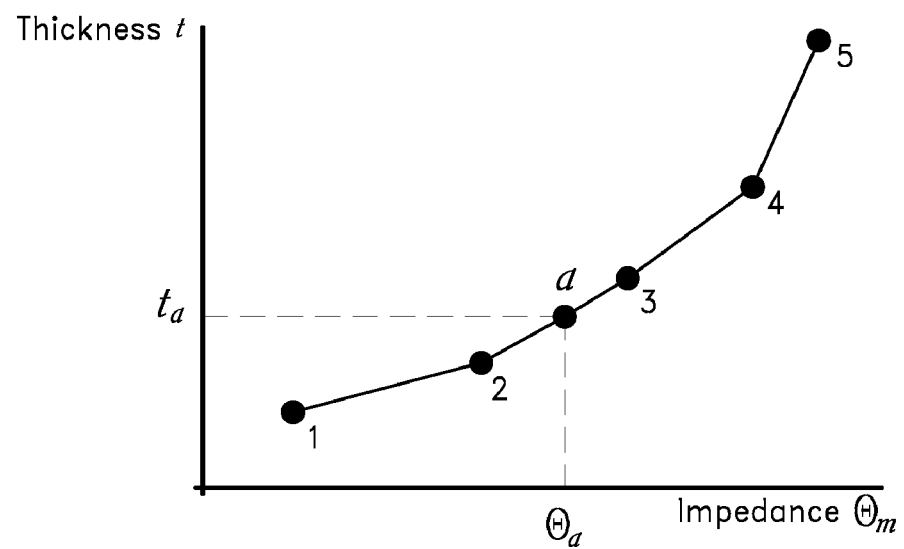
FIG. 9 graphically depicts linear piecewise continuous interpolation.

FIG. 9 illustrates application of continuous linear piecewise interpolation employing five calibration points 1, 2, 3, 4, 5, which are plotted based on the argument of impedance θ (or $\theta_m$ where the subscript m indicates the measured argument of impedance) derived from measured eddy current sensor values at known conductive layer thicknesses t. The slope and intercept of the line between each of the points (i.e., between points 1 and 2, between points 2 and 3, between points 3 and 4, and between points 4 and 5) can be solved using a two-equation, two-unknown matrix.

Upon using the calibrated eddy current sensor to measure the impedance θm for a conductive layer having an unknown thickness, the portion of the continuous interpolation used is the portion on which the measured impedance $\theta_m$ falls. For example, if the measured impedance $\theta_m$ is $\theta_a$, then the point a falls between points 2 and 3, and Equation 16 can used to determine the thickness $t_a$ of the conductive layer.

$$t_a = t_2 + \frac{(t_3 - t_2)}{(\theta_3 - \theta_2)} \cdot (\theta_a - \theta_2) \quad \text{Eq. 16}$$

where $t_2$ is thickness at point 2, $t_3$ is thickness at point 3, $\theta_2$ is impedance at point 2, and $\theta_3$ is impedance at point 3. It will be appreciated that if the point a fell between points 3 and 4, then Equation 17 would be appropriate.

$$t_a = t_3 + \frac{(t_4 - t_3)}{(\theta_4 - \theta_3)} \cdot (\theta_a - \theta_3) \quad \text{Eq. 17}$$

where $t_4$ is thickness at point 4 and $\theta_4$ is impedance at point 4. The error in measurement is a product of the distance between the calibration points. Thus, for increased accuracy in a particular range of thicknesses (e.g., at low and/or high thicknesses), more calibration wafers may be used.

If the measured impedance $\theta_m$ does not fall between two calibration points, Equations 18 and 19 may be used to extrapolate based on the lowest calibration point (e.g., point 1 in FIG. 9) or the highest calibration point (e.g., point 5 in FIG. 9).

$$\theta_m < \theta_{cal}^{min} \Rightarrow \quad \text{Eq. 18}$$

$$t_m = t_{cal}^{min} - \left( \frac{t_{cal}^{min+1} - t_{cal}^{min}}{\theta_{cal}^{min+1} - \theta_{cal}^{min}} \right) \cdot (\theta_{cal}^{min} - \theta_m)$$

$$\theta_m > \theta_{cal}^{max} \Rightarrow \quad \text{Eq. 19}$$

$$t_m = t_{cal}^{max} + \left( \frac{t_{cal}^{max} - t_{cal}^{max-1}}{\theta_{cal}^{max} - \theta_{cal}^{max-1}} \right) \cdot (\theta_m - \theta_{cal}^{max})$$

Applied to FIG. 9, $\theta_{cal}^{min}$ is $\theta_1$ (i.e., the impedance at point 1), $t_{cal}^{min}$ is $t_1$ (i.e., the thickness at point 1), $t_{cal}^{min+1}$ is $t_2$, $\theta_{cal}^{min+1}$ is $\theta_2$, $\theta_{cal}^{max}$ is $\theta_5$ (i.e., the impedance at point 5), $t_{cal}^{max}$ is $t_5$ (i.e., the thickness at point 5), $t_{cal}^{max-1}$ is $t_4$, and $\theta_{cal}^{max-1}$ is $\theta_4$. In embodiments in which an impedance measurement on a known thickness of zero (e.g., no calibration wafer or a calibration wafer free of a conductive layer), the linear piecewise continuous calibration curve is advantageously accurate to about zero thickness without extrapolation.

Figure 10A:
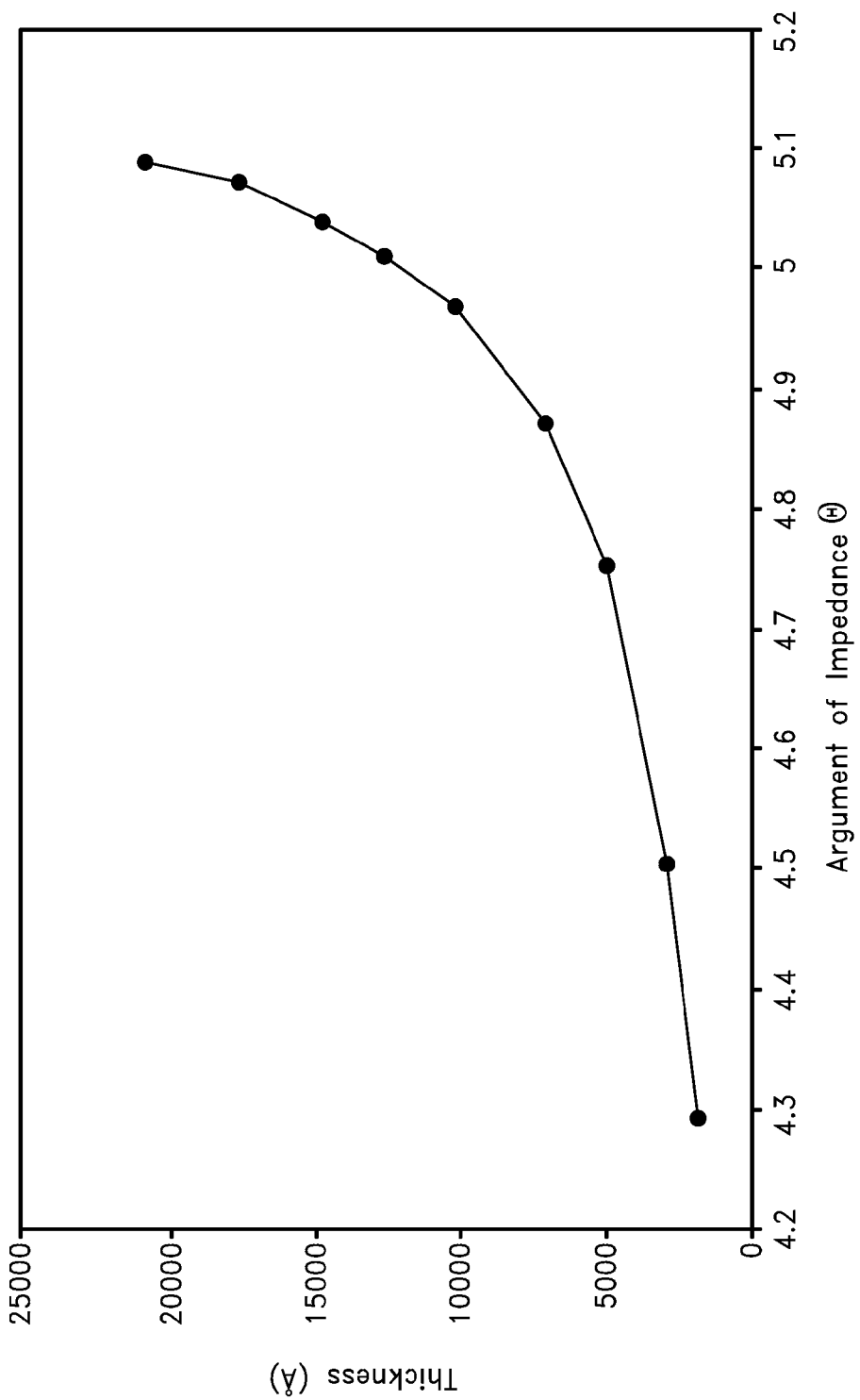
FIG. 10A is an example plot of actual thickness and modeled thicknesses for linear piecewise continuous interpolation versus argument of impedance $\theta$.

FIG. 10A illustrates a linear piecewise continuous interpolation calibration curve fit to the same set of calibration data, represented as circles, as described for FIGS. 5A-5E and 7. The calibration curve fits the actual data perfectly at each point (i.e., 0% error), and is accurate between the calibration points and at extrapolations, as well.

Although the mathematics may be more complicated, functions other than lines may also be used for each piecewise portion. For example, polynomials, trigonometric, hyperbolic, logarithmic, etc. functions may be used among subsets of points. In some embodiments, the functions do not overlap (e.g., as illustrated for the linear piecewise continuous interpolation of FIG. 10A), and as few as two functions may be created in FIG. 9 (i.e., a first function using points 1, 2, 3; and a second function using points 3, 4, 5).

Figure 10B:
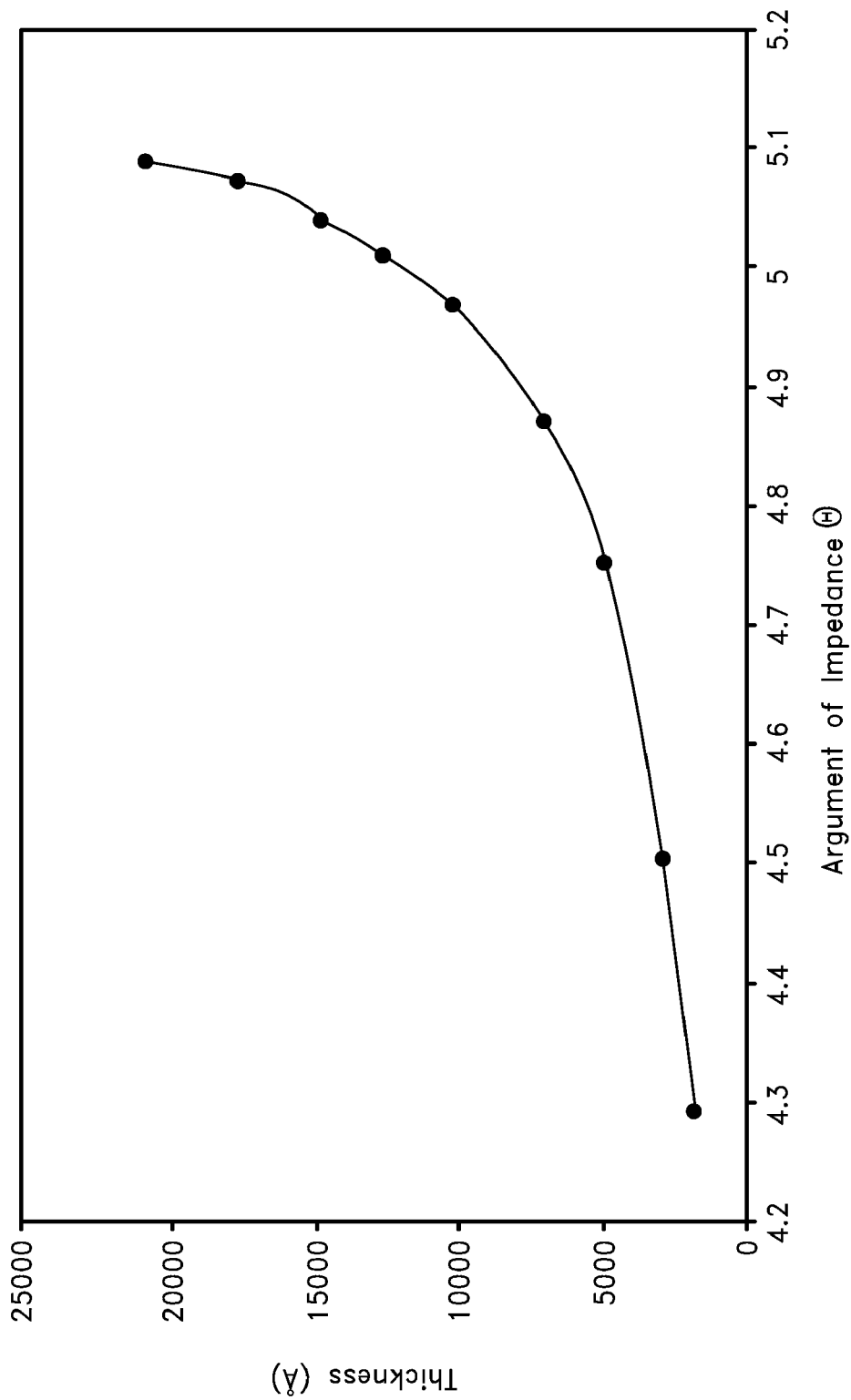
FIGS. 10B and 10C are example plots of actual thickness and modeled thicknesses for polynomial piecewise continuous interpolations versus argument of impedance $\theta$.

FIG. 10B illustrates a second order polynomial piecewise continuous interpolation calibration curve fit to the same set of calibration data, represented as circles. The calibration curves fit the actual data perfectly at each point, and are accurate between the points and at extrapolations, as well.

Figure 10C:
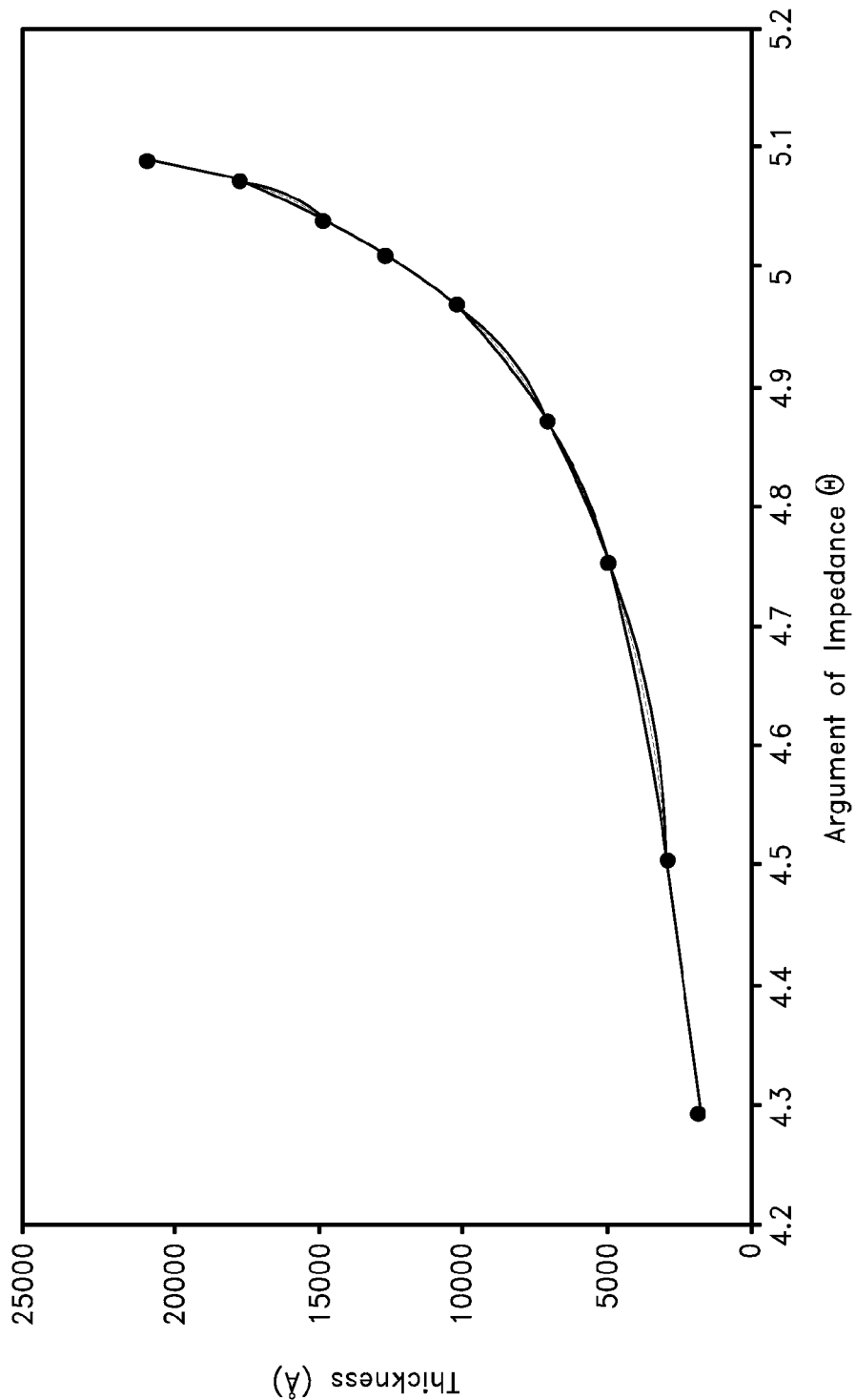

FIG. 10C illustrates an overlapping second order polynomial piecewise continuous interpolation calibration curve fit to the same set of calibration data, represented as circles. In some embodiments, the functions at least partially overlap (e.g., with respect to FIG. 9, a first function using points 1, 2, 3; a second function using points 2, 3, 4; and a third function using points 3, 4, 5). In certain such embodiments, the impedance $\theta_a$ of the point a would fall within either the first function or the second function, and the user is presented with a plurality of options, including but not limited to: use only the $t_a$ calculated from the first function (e.g., if $\theta_a$ is closer to $\theta_2$); use only the $t_a$ calculated from the second function (e.g., if $\theta_a$ is closer to $\theta_2$); use an average of $t_a$ calculated from the first function and $t_a$ calculated from the second function; use a weighted average of $t_a$ calculated based on the distance of the point a from the nearest calibration points; and use the $t_a$ calculated from the function at which $\theta_a$ has the smaller slope. As illustrated in FIG. 10C, the overlapping portions are close enough to each other that choosing the incorrect function would not produce a large amount of error.

The piecewise continuous interpolation therefore utilizes a search algorithm to find the appropriate function on which the measured impedance $\theta_m$ falls, and then plugs in the value of the measured impedance $\theta_m$ using that function to calculate the thickness $t_m$ of the conductive layer. Those of skill in the art will appreciate that methods described herein may be incorporated into computer code (e.g., into MATLAB® code) to automate determination of the values for the functions and use of the appropriate function to calculate thickness of a conductive layer. Referring again to FIG. 2, the eddy current sensor 214 may be in communication with the at least one controller 130, which may include a processor configured to execute a program that transforms a parameter measured by the eddy current sensor 214 (e.g., change in magnetic flux density, argument of impedance $\theta$) into a thickness of the conductive layer 205 in accordance with the continuous piecewise interpolation methods described herein.

Figure 11:
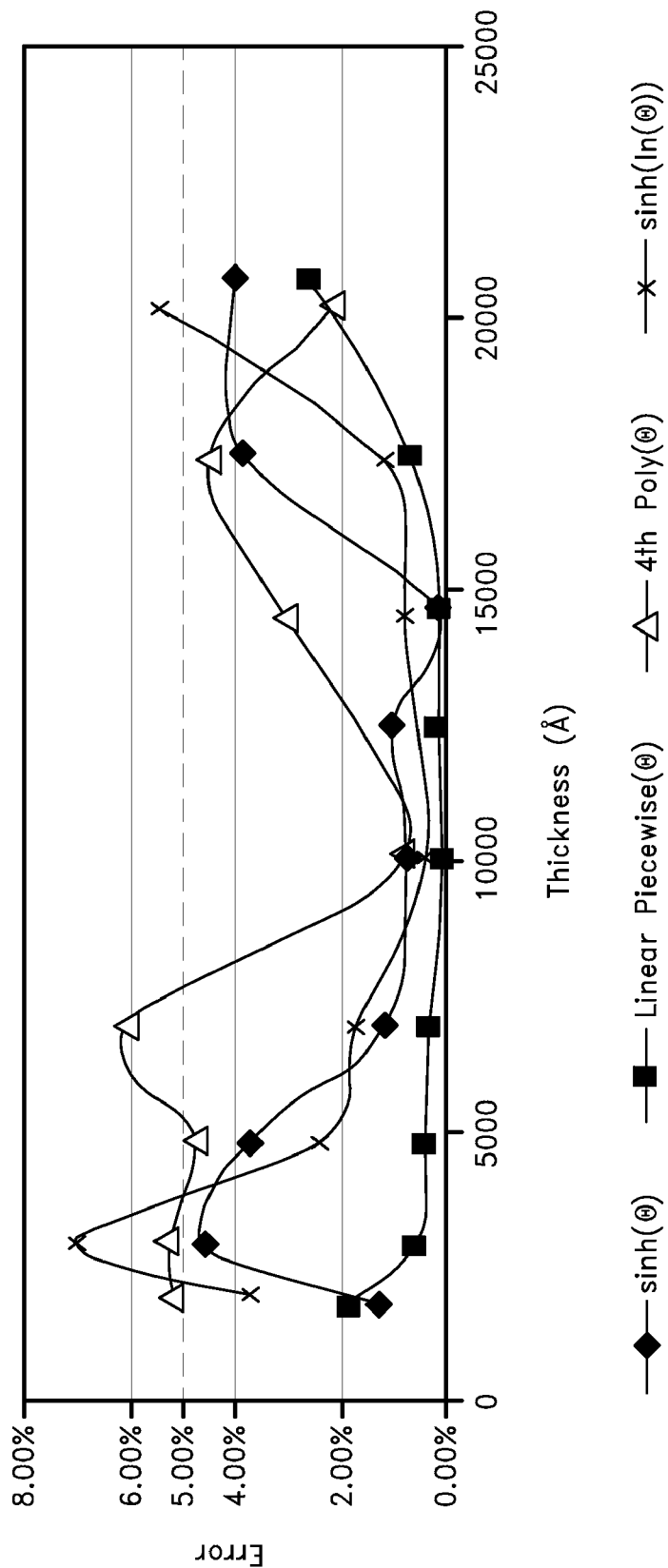
FIG. 11 is an example plot of thickness measurement error using a plurality of modeled thickness functions.

FIG. 11 is a comparison of the amount of measurement error among four calibration techniques at thicknesses ranging from about 1.8 kÅ to about 21 kÅ: smooth function interpolation wherein the function $h_f(\theta)$ is sinh (j·$\theta$); linear piecewise continuous interpolation; interpolation wherein the calibration curve is a fourth order polynomial (i.e., $c_1\theta^4 + c_2\theta^3 + c_3\theta^2 + c_4\theta + c_5$ where $c_1$, $C_2$, $C_3$, $C_4$, and $c_5$ are coefficients), and smooth function interpolation wherein the function $h_f(\theta)$ is ln [sinh(j·$\theta$)]. Although the illustrated error of the fourth order polynomial is about 8%, although this was a best case scenario, and the error was generally at least 15% and even more than 20%. The hyperbolic sine and linear piecewise interpolations produce the least amount of error, each having error of less than about 5% across the entire thickness range. In fact, the linear piecewise continuous interpolation achieves error of less than 2.6% and a standard deviation of abut 0.9% without any special adjustment in certain thickness regions (e.g., adding more calibration wafers at low and high ends of the range).

The high accuracy of thickness measurements from the eddy current sensors 214 by the smooth function interpolation and continuous piecewise interpolation calibration methods described herein can make the calibration of the sensors 214 robust to maintenance changes of the CMP apparatus 20 (e.g., changing the polishing pad 210, changing the platen 208, etc.). Accordingly, the calibration does not need to be repeated after routine maintenance, which excepts hardware redesigns and changes in the eddy current sensors. Eliminating calibration after routine maintenance can increase the productive time of the tool ("uptime"), thereby increasing throughput and reducing costs of manufacturing product workpieces. The uptime can be further extended due to a reduction in calibration wafers used in the initial calibration, as described above.

Endpoint and Transition Call Detection

With reference again to FIGS. 1 and 2, in certain embodiments, the monitored thickness of the conductive layer 205 may be used for endpoint detection and/or transition call detection in a polishing apparatus (e.g., the CMP apparatus 20). In endpoint detection for polishing, the apparatus is used to polish the conductive layer 205 of a workpiece 202 until the conductive layer 205 is substantially removed (e.g., being removed from the field region between damascene structures). At that point, the polishing process may be stopped, continued for a certain amount of time, etc. Previous eddy probe calibration techniques rendered them unsuitable for endpoint detection because they were not sufficiently accurate at low thicknesses (for example as illustrated in FIGS. 5A-5E). As a result, the polishing was typically timed based on incoming conductive layer thickness and polishing rate, which could lead to over-polishing or under-polishing if the wafer had a different incoming conductive layer thickness or polishing rate. However, calibration techniques in which the accuracy is less than 5% across a range of thicknesses that includes thicknesses below about 1 kÅ can provide endpoint detection having accuracy down to about 200 to 500 Å.

In transition call detection for polishing, the apparatus is used to polish the bulk of the conductive layer 205 of a workpiece 202 with a first process recipe, for example having an aggressive polishing rate, until the conductive layer 205 is very thin (e.g., to between about 3 kÅ and 5 kÅ). At that point, the polishing process may be switched to a second polishing recipe that polishes the remaining conductive layer, for example having a less aggressive polishing rate (e.g., until the remaining conductive layer is substantially removed). Previous eddy probe calibration techniques rendered them unsuitable for transition call detection because they were not accurate at low thicknesses (for example as illustrated in FIGS. 5A-5E). However, calibration techniques in which the accuracy is less than 5% across a range of thicknesses that includes thicknesses below about 3.5 kÅ (e.g., to about 3 kÅ, 1 kÅ, etc.) can provide suitable endpoint detection, as the transition call is generally made at thicknesses less than about 3.5 kÅ.

Endpoint and transition call detection using accurately calibrated eddy current sensors can be extended to other processes as well, for example conductive layer plating. In endpoint detection for plating, the apparatus is used to plate the conductive layer 205 of a workpiece 202 until the conductive layer 205 is at or proximate to a desired thickness. At that point, the plating process may be stopped, continued for a certain amount of time, etc. In transition call detection for plating, the apparatus is used to plate the conductive layer 205 of a workpiece 202 with a first process recipe, for example configured to fill small openings (e.g., damascene trenches or contact vias for wafer metallization), until the conductive layer 205 is at or proximate to a desired initial thickness. After reading the transition call, indicating a thickness sufficient to fill the small openings, the remainder of the plating can be conducted with a second process recipe, for example configured to fill wide features without as much concern for bottom-up filling.

Detection of the transition point allows process parameters (e.g., pressure, temperature, current, slurry flow, oscillation/rotation speed, etc.) to be changed to efficiently remove or plate the conductive layer 205, but to not over-polish or over-deposit the layer on the workpiece 202, which may cause defects such as dishing or which may increase costs due to longer process times, more material usage, or longer downstream process times. In certain embodiments, the eddy current sensor calibration utilized to monitor thickness can change after the transition detection (e.g., to a more accurate calibration at low or high thicknesses).

In certain embodiments, the polishing station 200 includes an optical sensor (not shown) that is configured to determine certain parameters such as the thickness of a conductive or non-conductive layer 205 on the workpiece 202. For example, an optical sensor may simply detect a change in reflectivity or color of the workpiece (e.g., through a window in the polishing pad 210) as the layer 205 is substantially removed. Such a sensor can advantageously be used to supplement an eddy current sensor. For example, an endpoint may be determined when both an optical sensor and an eddy current sensor indicate that the thickness of the layer has been reduced to a desired value. The optical sensor can also be used as a "check" against the eddy current sensor. However, as explained below, optical sensors alone may disadvantageously increase costs and complexity.

Figure 12B:
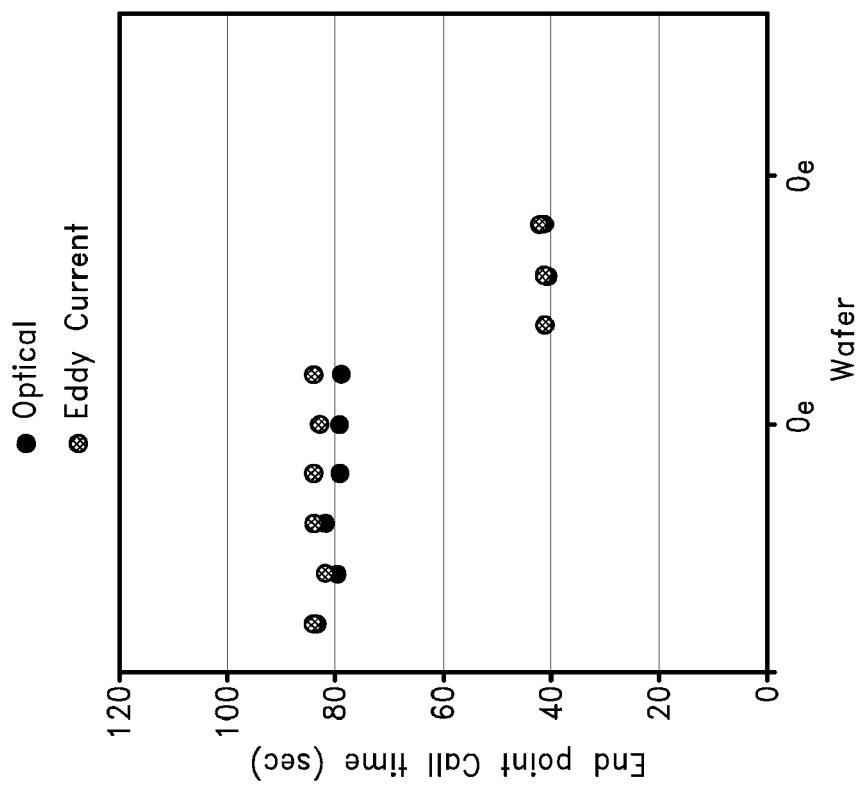
FIGS. 12A and 12B are example plots of endpoint call times using a variety of techniques.
Figure 12A:
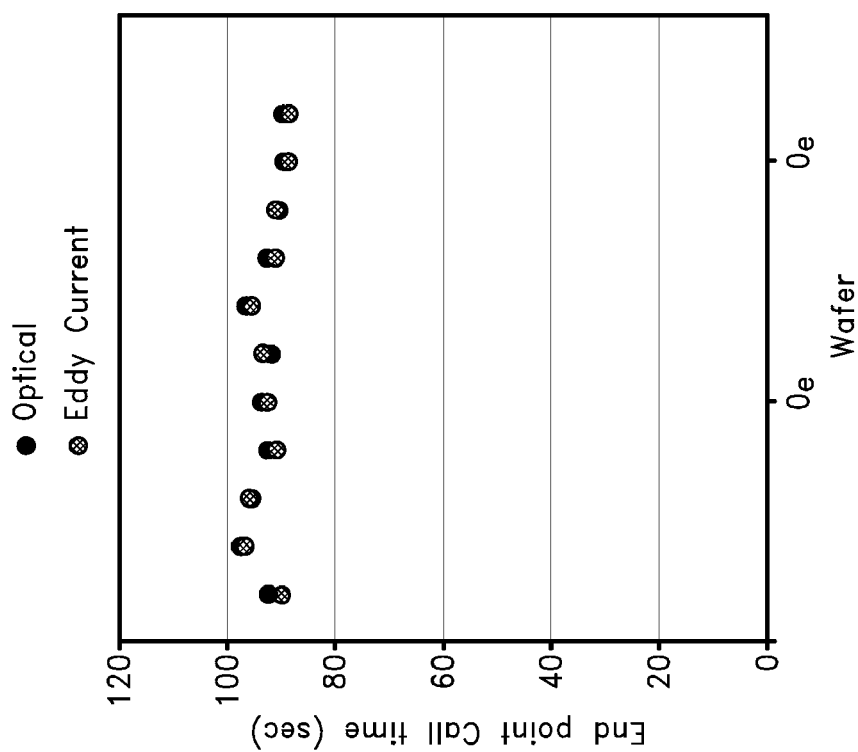

FIG. 12A illustrates experimental polish endpoint detection times for eleven wafers coated with a blanket layer of deposited copper. The endpoint detection time is the time from beginning of a polishing process to the time when the thickness is proximate to a desired value (e.g., between about 200 and 500 Å). In the experiment depicted in FIG. 12A, the endpoints were detected on each of the blanket wafers using both eddy current sensors calibrated as described herein and optical sensors. FIG. 12A shows that the endpoint detection times using eddy current sensors (cross-hatched) are substantially similar to the endpoint detection times using optical sensors (solid), which illustrates that properly calibrated eddy current sensors can be used to accurately determine when to stop polishing a wafer at least as accurately as an optical sensor.

FIG. 12B illustrates experimental polish endpoint detection times for nine patterned wafers having a layer of copper deposited thereon. The endpoints were detected on each of the patterned wafers using both eddy current sensors calibrated as described herein and optical sensors. FIG. 12B shows that, even on patterned wafers, the endpoint detection times using eddy current sensors (cross-hatched) are substantially similar to the endpoint detection times using optical sensors (solid), which illustrates that properly calibrated eddy current sensors can be used to determine when to stop polishing a patterned wafer at least as accurately as an optical sensor. The endpoint times in FIG. 12B are bimodal because the group clustered around 80 seconds detected an endpoint for 10 kÅ of copper over a standard feature pattern and the group clustered around 40 seconds detected an endpoint for 5.5 kÅ of copper over a different standard feature pattern. The endpoint detection on the wafers having the standard feature pattern was more consistent using the calibrated eddy current sensors (standard deviation of about 0.8 seconds) than using the optical sensors (standard deviation of about 2.1 seconds).

The accuracy of the calibrated eddy current sensors for endpoint detection advantageously allows an optical sensor to be omitted from CMP apparatuses. Eliminating the optical sensor can significantly reduce costs of the CMP apparatus, for example due to the expense of the sensor and related subsystems (e.g., polishing pads including a window for the optical sensor to view the workpiece), and by reducing the complexity of the CMP apparatus (e.g., by reducing the number of wires coupled to rotating parts).

Figure 13A:
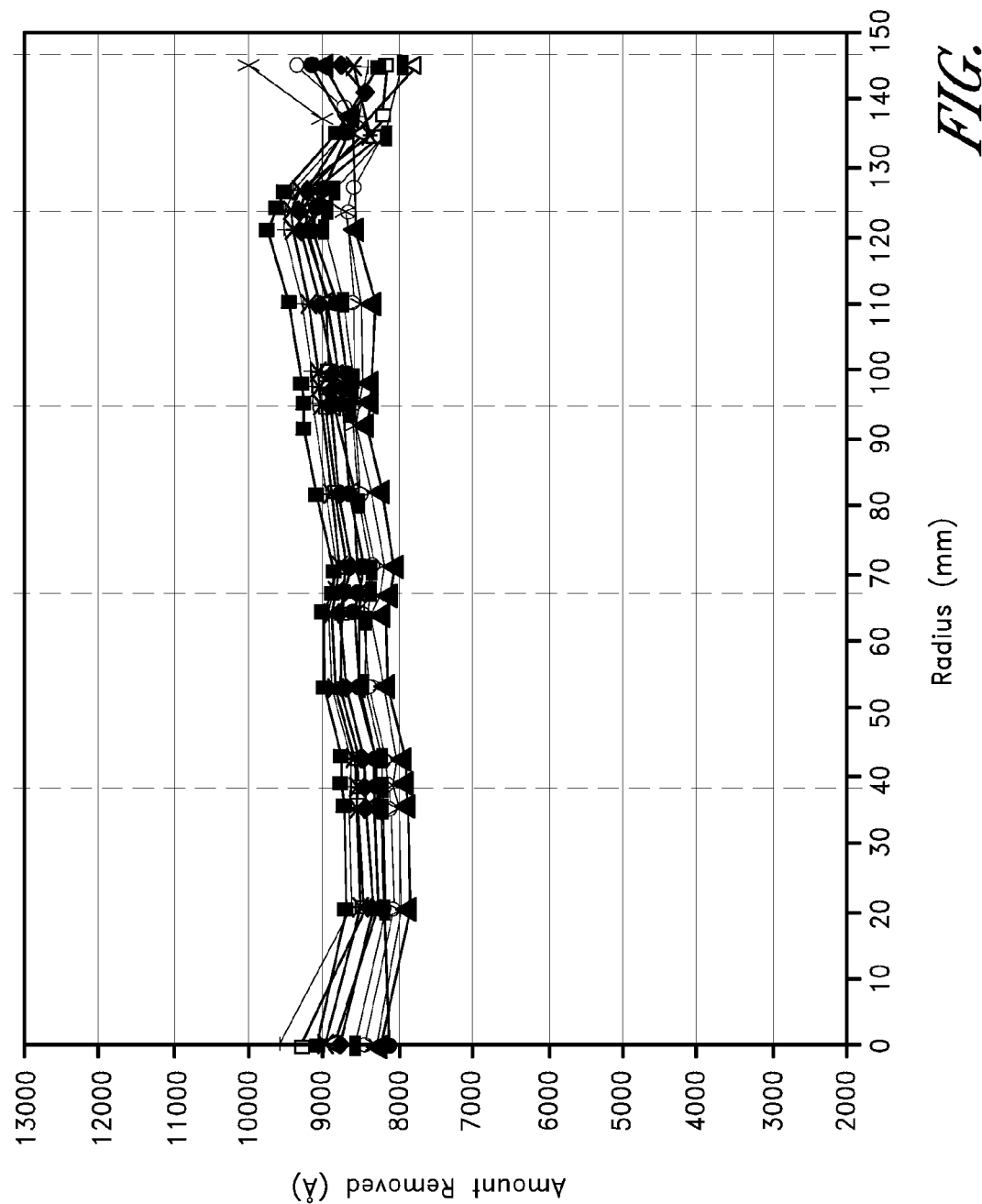
FIG. 13A is an example plot of conductive layer thickness during removal prior to a transition detection.
Figure 13B:
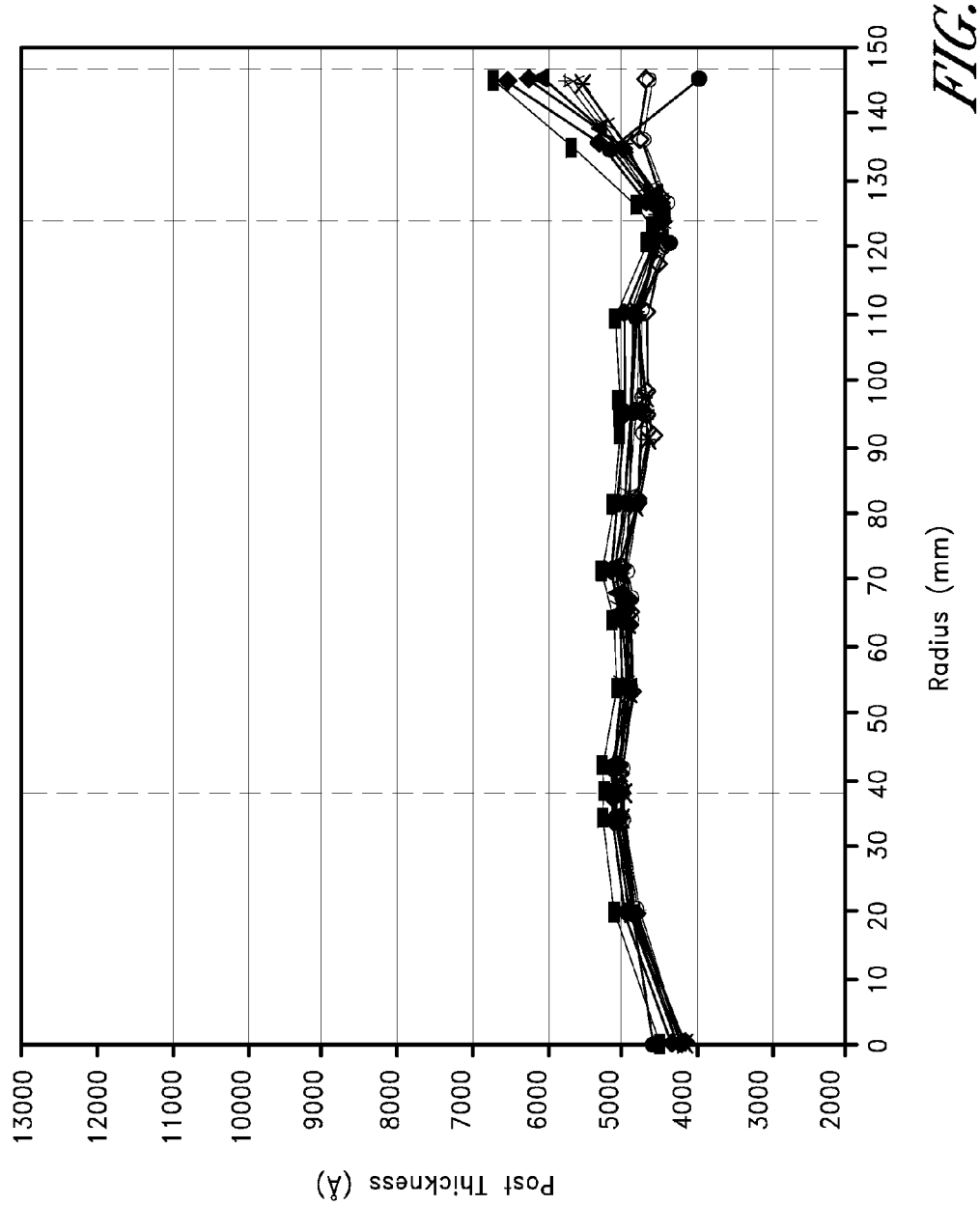
FIG. 13B is an example plot of conductive layer thickness remaining after a transition detection.

FIGS. 13A and 13B illustrate experimental results for copper polishing of 1,000 wafers. Eddy current sensors calibrated with methods described herein were used to determine the transition call from bulk polishing from a conductive layer thickness of about 12 kÅ to a thickness of about 3 kÅ. FIG. 13B shows that the remaining copper after the transition determination was consistent, with the wafer-to-wafer range being about 377 Å. FIG. 13A shows that the amount of copper removed varied by about 729 Å, which can be attributed to different incoming conductive layer thicknesses on different test wafers. Thus, regardless of the incoming thickness of the conductive layer, the calibrated eddy current sensors were able to accurately measure thickness and stop the polishing process at a predetermined thickness. Such consistency is advantageous for uniformly further processing the wafers (e.g., by switching to a second recipe having a less aggressive polishing rate).

Continuous Closed Loop Control

As described above, the smooth function interpolation and continuous piecewise interpolation eddy current sensor calibration methods described herein are accurate (e.g., within 5% error) over a large range of thickness values (e.g., at least between about less than 1 kÅ and about 20 kÅ). Such accuracy allows closed loop control ("CLC") of polishing and plating processes. In closed loop control, measured thickness (by way of eddy current measurement of impedance) can be used to adjust one or more process parameters during processing. For example, if the average thickness of the conductive layer 205 on a workpiece 202 being polished is too high, the CLC system can increase the rate of relative motion between the workpiece 202 (and/or subsequent workpieces) and the polishing pad 210 (e.g., by increasing the orbital or rotational speed of the workpiece carrier 206). Changing a wide variety of process parameters are possible, including but not limited to, a process recipe, an on/off state, pressure, temperature, fluid (e.g., slurry) flow, movement (e.g., oscillation or rotation) speed, and current.

In some embodiments, each sensor 300a, 300b, 300c, 300d (FIGS. 3A and 3B) corresponds to a processing zone in which one or more parameters may be changed based on the thickness measurement. The shape of the zones may correspond to the movement between the workpiece 202 and the sensors 300a, 300b, 300c, 300d (e.g., arcuate, annular, linear, etc.). As an example, in the workpiece carrier 206 (FIG. 2), the bladder may have corresponding zones such that head pressure can be changed for only part of a workpiece being processed. Thus, if the sensor 300b determines that a thickness is too high relative to the thickness determined by the sensors 300a, 300c, 300d, the head pressure in the zone corresponding to the sensor 300b may be increased such that the portions of the workpiece 202 in that zone have more contact with the polishing pad 210, thereby increasing the polishing rate. As will be appreciated by the skilled artisan in view of the present disclosure, examples of parameters that can be changed differently in different zones includes, but is not limited to, pressure, temperature, fluid (e.g., slurry) flow, movement (e.g., oscillation or rotation) speed, and current.

Figure 14:
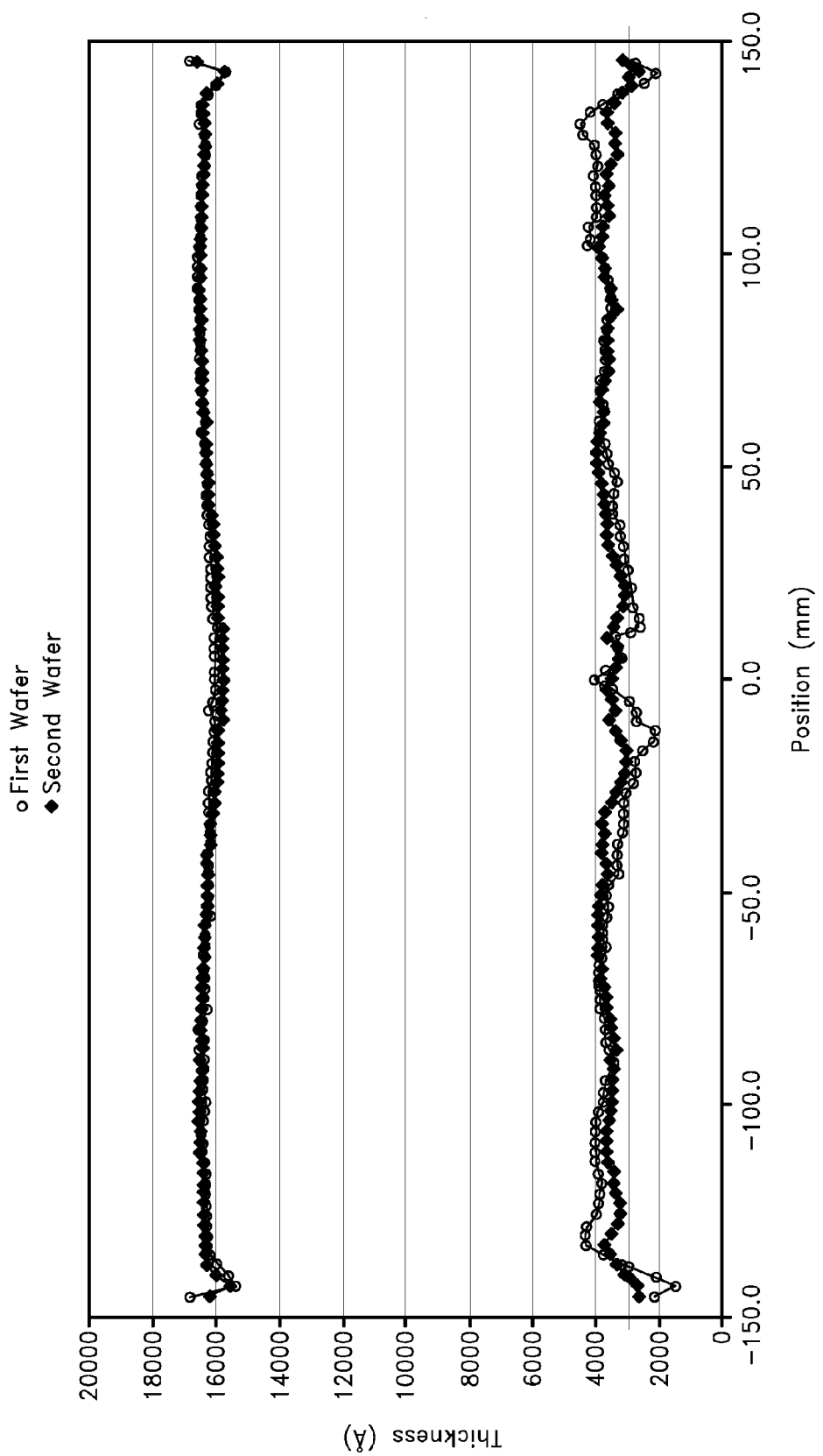
FIG. 14 is an example conductive layer thickness profile before and after polishing using a variety of techniques.

FIG. 14 illustrates an experimental plot of the polishing of a conductive layer from two wafers. Both wafers started with a conductive layer having a thickness of about 16 kÅ and were polished to a target thickness of about 3 kÅ. The first wafer (open circles) was polished without using CLC (i.e., the process parameters were constant throughout the polishing process). The incoming profile was not preserved (i.e., the thickness on the edges became much lower than the thickness over most of the rest of the wafer), and the 1-sigma variation was about 457 Å (3.57%). The second wafer (solid diamonds) was polished using CLC for six zones in which the pressure was changed in each zone based on a monitored thickness. The incoming profile was advantageously preserved (i.e., the thickness difference on the edges of the wafer more closely matched the thickness difference on the edges of the incoming wafer), and the 1-sigma variation was about 275 Å (2.15%). Thus, the second wafer polished using CLC had better uniformity and was better able to maintain a desired within-wafer thickness profile.

It will be appreciated that the methods described herein are not limited to any particular process or tool, but may be used for any tool or process in which knowledge of the thickness of a conductive layer may be useful. Examples of suitable tools are the XCEDA™ CMP tool and SABRE® Electrofill™ tool, both available from Novellus Systems, Inc. of San Jose, Calif. The eddy current sensor calibration methods described herein may also be used as a general mathematical platform to calibrate systems for which calibration over a broad range of conductive layer thicknesses is desired. For example, eddy current sensors can be used to determine the thickness of conductive layers prior to or after conductive layer processes, in situ and/or ex situ.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A method of processing a wafer, the method comprising:
   changing the thickness of a conductive layer on the wafer; and
   during changing, monitoring the thickness of the conductive layer, wherein monitoring the thickness comprises correlating a measurement from an eddy current sensor to a thickness of the conductive layer, wherein correlating the measurement to the thickness comprises calculating an argument of impedance based on a real part corrected for zero-error and an imaginary part of the measurement corrected for zero-error and applying a model correlating the argument of impedance to the thickness of the conductive layer, wherein zero-error is a known thickness of zero.

2. The method of claim 1, wherein changing comprises polishing the conductive layer.

3. The method of claim 1, wherein changing comprises plating the conductive layer.

4. The method of claim 1, further comprising:
   indicating a transition point when a monitored thickness is proximate to a predetermined value; and
   continuing to change the thickness of the conductive layer after indicating the transition point.

5. The method of claim 1, further comprising indicating an endpoint when a monitored thickness is proximate to a predetermined value.

6. The method of claim 5, wherein the predetermined value is less than about 500 Å.

7. The method of claim 1, further comprising adjusting a tool parameter by using the monitored thickness.

8. The method of claim 7, wherein adjusting the tool parameter comprises closed loop control.

9. The method of claim 8, wherein monitoring the thickness comprises using a plurality of eddy current sensors to separately monitor the thicknesses of the conductive layer in a plurality of different zones.

10. The method of claim 9, further comprising adjusting a tool parameter in one of said zones separately from others of said zones using the monitored thicknesses.

11. A method of determining a thickness of a conductive layer on a workpiece, the method comprising:
    measuring a magnetic flux density change when the conductive layer on the workpiece is in a magnetic field, wherein measuring the magnetic flux density change comprises measuring a real part and an imaginary part; and
    calculating the thickness of the conductive layer using a calibration curve formed by relating the real part of the magnetic flux density change corrected for zero-error and the imaginary part corrected for zero-error of the magnetic flux density change to thickness of a conductive layer disposed in the magnetic field, wherein zero-error is a known thickness of zero.

12. The method of claim 11, wherein relating the magnetic flux density change to thickness comprises calculating an argument of impedance.

13. The method of claim 11, wherein the calibration curve connects a plurality of calibration points with a continuous piecewise function.

14. The method of claim 13, wherein calculating the thickness is accurate to within 5% error over a range of conductive layer thicknesses from about 1 kÅ to about 20 kÅ.

15. The method of claim 11, wherein the calibration curve fits an analytic function having infinite order terms to a plurality of calibration points.

16. The method of claim 15, wherein the calibration curve comprises a function chosen from the group consisting of: trigonometric, hyperbolic, logarithmic, and combinations thereof.

17. The method of claim 15, wherein the calibration curve comprises hyperbolic sine (sinh).

18. A method of calibrating an eddy current sensor, the method comprising:
    generating a magnetic field;
    calculating an argument of impedance comprising a real part corrected for zero-error and an imaginary part corrected for zero-error when each of a plurality of wafers comprising conductive layers having known thicknesses are passed therethrough, wherein zero-error is a known thickness of zero; and
    forming a calibration curve correlating the calculated arguments of impedance to the known thicknesses.

19. The method of claim 18, wherein the plurality of wafers is less than six wafers.

20. A method of determining a thickness of a conductive layer on a workpiece, the method comprising:
    using an eddy current sensor to measure a value based on a real part and an imaginary part when the conductive layer on the workpiece is in a magnetic field;
    correcting the real part for zero-error;
    correcting the imaginary part for zero-error, wherein zero-error is a known thickness of zero; and
    calculating the thickness of the conductive layer using a calibration curve that correlates thickness to the corrected real part and the corrected imaginary part, wherein the calibration curve comprises a continuous piecewise function or an analytic function having infinite order terms, the calculated thickness being within 5% error over a range from about 1 kÅ to about 20 kÅ.

21. An apparatus for determining thickness, the apparatus comprising:
    an eddy current sensor calibrated to measure a magnetic flux density change comprising a real part and an imaginary part when a conductive layer on a workpiece is in a magnetic field; and
    a processor configured to execute a program that corrects the real part of the measured magnetic flux density change for zero-error, that corrects the imaginary part of the measured magnetic flux density change for zero-error, wherein zero-error is a known thickness of zero, and that transforms the corrected real part and the corrected imaginary part into a calculated thickness of the conductive layer, wherein the program comprises a calibration curve fit to a plurality of calibration points.

22. The method of claim 1, wherein the model includes a continuous piecewise function.

23. The method of claim 1, wherein the model includes an analytic function having infinite order terms.

24. The method of claim 18, wherein forming the calibration curve comprises using a continuous piecewise function.

25. The method of claim 18, wherein forming the calibration curve comprises using an analytic function having infinite order terms.

26. The apparatus of claim 21, wherein the calibration curve comprises a continuous piecewise function.

27. The apparatus of claim 21, wherein the calibration curve comprises an analytic function having infinite order terms.

28. The method of claim 23, wherein applying the model is accurate to within 5% error over a range from about 1 kÅ to about 20 kÅ.

29. The method of claim 15, wherein calculating the thickness is accurate to within 5% error over a range of conductive layer thicknesses from about 1 kÅ to about 20 kÅ.

30. The method of claim 18, wherein calculating the argument of impedance comprises passing each of said plurality of wafers only once.

31. The method of claim 22, wherein applying the model is accurate to within 5% error over a range from about 1 kÅ to about 20 kÅ.

32. The method of claim 23, wherein the analytic function comprises hyperbolic sine (sinh).

* * * * *